(12) United States Patent
Takayama et al.

(10) Patent No.: US 11,081,376 B2
(45) Date of Patent: Aug. 3, 2021

(54) SUBSTRATE PROCESSING APPARATUS, TRANSFER MODULE, AND COUPLING MODULE

(71) Applicant: SCREEN Holdings Co., Ltd., Kyoto (JP)

(72) Inventors: Yuichi Takayama, Kyoto (JP); Koji Hashimoto, Kyoto (JP); Noriyuki Kikumoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/684,865

(22) Filed: Nov. 15, 2019

(65) Prior Publication Data

US 2020/0211870 A1 Jul. 2, 2020

(30) Foreign Application Priority Data

Dec. 28, 2018 (JP) ............................. JP2018-247433

(51) Int. Cl.
*H01L 21/67* (2006.01)
*B65G 47/90* (2006.01)
*H01L 21/687* (2006.01)

(52) U.S. Cl.
CPC ...... *H01L 21/67184* (2013.01); *B65G 47/907* (2013.01); *H01L 21/67017* (2013.01); *H01L 21/67196* (2013.01); *H01L 21/68707* (2013.01)

(58) Field of Classification Search
None
See application file for complete search history.

(56) References Cited

U.S. PATENT DOCUMENTS 9,956,565 B2 * 5/2018 Inagaki ............ H01L 21/67126
2007/0081881 A1 4/2007 Okuno et al.
(Continued)

FOREIGN PATENT DOCUMENTS

JP 2017-183447 A 10/2017
KR 10-2013-0096182 A 8/2013
(Continued)

OTHER PUBLICATIONS

Office Action dated Nov. 24, 2020 in corresponding Taiwanese Patent Application No. 108142671 and Search Report with partial English translation based on attached Japanese translation.
(Continued)

*Primary Examiner* — Ronald P Jarrett
(74) *Attorney, Agent, or Firm* — Ostrolenk Faber LLP

(57) ABSTRACT

A first processing module includes a first specified processing unit and a first delivery part. A substrate supply part is on a first direction side of the first processing module. A transfer module is on a second direction side on the opposite of the first processing module from the first direction. The transfer module includes a frame, a first floor, a second floor, and a gateway. The frame defines a placement space in which a first transfer apparatus of the transfer module is placed. A first transfer apparatus is installed on the first floor. The second floor is on a third direction side, which is a horizontal direction orthogonal to the first direction, with respect to the first floor inside the placement space. The gateway is provided on the third direction side with respect to the second floor and communicates the placement space to the outside of the frame.

25 Claims, 12 Drawing Sheets

(56) References Cited

U.S. PATENT DOCUMENTS

2009/0014431 A1    1/2009  Oh et al.
2018/0327214 A1*  11/2018  Armistead ........... G01C 21/206
2019/0019706 A1    1/2019  Takusari et al.

FOREIGN PATENT DOCUMENTS

TW    200715454 A    4/2007
TW    200903688 A    1/2009

OTHER PUBLICATIONS

Notification of Reason or Refusal dated Apr. 8, 2021 in corresponding Korean Patent Application No. 10-2019-0174482 with English translation obtained from Global Dossier.

* cited by examiner

SUBSTRATE PROCESSING APPARATUS, TRANSFER MODULE, AND COUPLING MODULE

BACKGROUND OF THE INVENTION

Field of the Invention

The present invention relates to a substrate processing apparatus for processing a substrate. Examples of substrates to be processed include semiconductor substrates, flat panel display (FPD) substrates such as liquid crystal display apparatuses and organic electroluminescence (EL) display apparatuses, optical disk substrates, magnetic disk substrates, magneto-optical disk substrates, photomask substrates, ceramic substrates, solar cell substrates, and printed circuit boards.

Description of the Background Art

In a semiconductor device manufacturing process, a substrate processing apparatus including a single wafer processing unit that processes substrates one by one is used. In addition, a substrate processing apparatus in which a plurality of processing units are integrated is used to increase production efficiency.

A substrate processing apparatus disclosed in FIG. 1 of Japanese Patent Application Laid-Open No. 2017-183447 includes an indexer robot, a first main robot, and a second main robot as transfer robots for transferring a substrate. These are disposed in this order along one direction. First and second placement portions for placement of a substrate are provided between the indexer robot and the first main robot and between the first and second main robots, respectively. Processing units are provided on both sides of each of the first and second main robots. The indexer robot takes out an unprocessed substrate from a cassette and transfers the substrate to the first placement portion. The first main robot takes out the substrate from the first placement portion and transfers the substrate to the surrounding processing unit or the second placement portion. The second main robot takes out the substrate from the second placement portion and transfers the substrate to the surrounding processing unit. The substrate having completed the process in each processing unit is returned to the cassette in the reverse route.

Further, in a substrate processing apparatus disclosed in FIG. 10 of the above publication, the second placement portion, the second main robot, and the surrounding processing unit are omitted, and a cassette placement portion, the indexer robot, the first placement portion, the first main robot, and the surrounding processing units constitute the substrate processing apparatus.

The substrate processing apparatus of FIG. 1 of the above publication has an opening on the side opposite to the second placement portion across the second main robot. An operator can enter the substrate processing apparatus through this opening and approach the second main robot. However, with the first main robot surrounded by the first and second placement portions and the processing units, it has not been easy for the operator to approach the first main robot.

The substrate processing apparatus of FIG. 10 of the above publication is provided with an opening on the side opposite to the first placement portion across the first main robot. An operator can enter the substrate processing apparatus through this opening and approach the first main robot. However, in the case of this substrate processing apparatus, a position where the processing unit can be disposed is limited only to both sides of the first main robot, thereby limiting the number of processing units.

SUMMARY

An object of the present invention is to provide a technique that facilitates the maintenance of a transfer robot while enabling the addition of a processing unit.

In order to solve the above problems, a first aspect is a substrate processing apparatus for processing a substrate, the apparatus being provided with: a first processing module having a first specified processing unit that performs specified processing on the substrate, and a first delivery part that temporarily holds the substrate; a substrate supply part that is disposed on a first direction side of the first processing module and supplies the substrate from the first direction side to the first delivery part; and a transfer module being disposed on a second direction side opposite to the first direction of the first processing module and having a first transfer apparatus that unloads the substrate out of the first delivery part in the second direction and loads the substrate into the first specified processing unit. The transfer module includes: a frame that defines a placement space in which the first transfer apparatus is placed; a first floor being disposed inside the placement space, a base portion of the first transfer apparatus being installed on the first floor; a second floor disposed on a third direction side with respect to the first floor inside the placement space, the third direction being a horizontal direction orthogonal to the first direction; and a gateway that is provided on the third direction side with respect to the second floor and communicates the placement space with an outside of the frame.

A second aspect is the substrate processing apparatus according to the first aspect, in which the first transfer apparatus includes a hand that holds the substrate, and a vertical actuator including a vertical motor that moves the hand in a vertical direction.

A third aspect is the substrate processing apparatus according to the second aspect, in which the first floor is provided vertically below the second floor.

A fourth aspect is the substrate processing apparatus according to the second aspect or the third aspect, in which the first transfer apparatus includes a horizontal actuator including a movement motor that moves the hand in a direction to move away from or approach the base portion in the horizontal direction, and the first floor is provided on a side opposite to the third direction with respect to the first delivery part.

A fifth aspect is the substrate processing apparatus according to the fourth aspect, in which the first specified processing unit has a nozzle that supplies fluid to the substrate.

A sixth aspect is the substrate processing apparatus according to the fifth aspect, being further provided with a supply pipe that is disposed across the transfer module and the first processing module and supplies the fluid to the nozzle.

A seventh aspect is the substrate processing apparatus according to the sixth aspect, being further provided with a cylindrical bellows member into which the supply pipe is inserted. The first processing module has a first piping chamber in which the supply pipe is disposed, the transfer module has a second piping chamber in which the supply pipe is disposed, and an opening on one end of the bellows member is coupled to the first piping chamber, and an opening on the other end is coupled to the second piping chamber.

An eighth aspect is the substrate processing apparatus according to any one of the fifth aspect to the seventh aspect, in which a pipe connection port to which the fluid is supplied is provided below the second floor.

A ninth aspect is the substrate processing apparatus according to any one of the first aspect to the eighth aspect, the apparatus being provided with: a second processing module disposed on the second direction side of the transfer module and having a second delivery part that temporarily holds the substrate loaded by the first transfer apparatus from the first direction side, and a second specified processing unit that performs specified processing on the substrate; a third processing module disposed on the second direction side of the second processing module and having a third specified processing unit that performs specified processing on the substrate; and a second transfer apparatus that transfers the substrate between the second delivery part and the second specified processing unit and between the second delivery part and the third specified processing unit.

A tenth aspect is a transfer module for transferring a substrate in a substrate processing apparatus including a first processing module having a first specified processing unit that performs specified processing on the substrate; the module being provided with: a first transfer apparatus that transfers the substrate to the first specified processing unit from a second direction side; a frame that defines a placement space in which the first transfer apparatus is placed; a first floor disposed inside the placement space, a base portion of the first transfer apparatus being installed on the first floor; a second floor disposed on a third direction side with respect to the first floor inside the placement space, the third direction being in a horizontal direction orthogonal to the second direction; and a gateway that communicates the placement space with an outside of the frame through the second floor.

An eleventh aspect is a coupling module provided in a substrate processing apparatus that processes a substrate, the module being provided with: a first processing module; and a transfer module coupled to the first processing module on a second direction side. The first processing module has a first specified processing unit that performs specified processing on the substrate, and a first delivery part that temporarily holds the substrate, and the transfer module has a first transfer apparatus that unloads the substrate out of the first delivery part to the second direction side and loads the substrate into the first specified processing unit from the second direction side.

According to the substrate processing apparatus of the first aspect, at the time of performing the maintenance of the first transfer apparatus, an operator can approach the first transfer apparatus by moving on the second floor through the gateway of the transfer module. Further, the first processing module and the transfer module can be alternately coupled in the second direction. In this case, the transfer apparatus can receive the substrate from the first delivery part of the previous first processing module and pass the substrate to the first delivery part of the next first processing module. In this manner, the substrate can be supplied to the subsequent first processing module. Therefore, the first specified processing unit can be easily added by alternately coupling the first processing module and the transfer module in the second direction.

According to the substrate processing apparatus of the second aspect, the substrate held by the hand can be transferred in the vertical direction.

According to the substrate processing apparatus of the third aspect, the hand can be moved to a lower position by disposing the first floor lower than the second floor. Thereby, the substrate can be transferred to a low position.

According to the substrate processing apparatus of the fourth aspect, the base portion of the first transfer apparatus is disposed on the first floor provided on the side opposite to the third direction. Further, the hand can be accessed from the side opposite to the third direction of the first delivery part by moving the hand in the direction to move away from or approach the base portion in a horizontal direction.

According to the substrate processing apparatus of the fifth aspect, the substrate can be processed with the fluid.

According to the substrate processing apparatus of the sixth aspect, fluid can be supplied from the transfer module side to the processing module side.

According to the substrate processing apparatus of the seventh aspect, the portion of the supply pipe disposed at the connection portion between the first processing module and the transfer module can be surrounded by the bellows member. It is thereby possible to reduce the leakage of an atmosphere including the fluid to the outside of the apparatus at the connection portion between the first processing module and the transfer module.

According to the substrate processing apparatus of the eighth aspect, since the pipe connection port is provided below the second floor, the operator can perform maintenance without stepping on the pipe connection port.

According to the substrate processing apparatus of the ninth aspect, it is possible to add the second specified processing unit and the third specified processing unit while facilitating access to the first transfer apparatus.

According to the transfer module of the tenth aspect, at the time of performing the maintenance of the first transfer apparatus, the operator can approach the first transfer apparatus by moving on the second floor through the gateway of the transfer module.

According to the coupling module of the eleventh aspect, the first specified processing unit can be easily added by alternately coupling the first processing module and the transfer module in the second direction.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
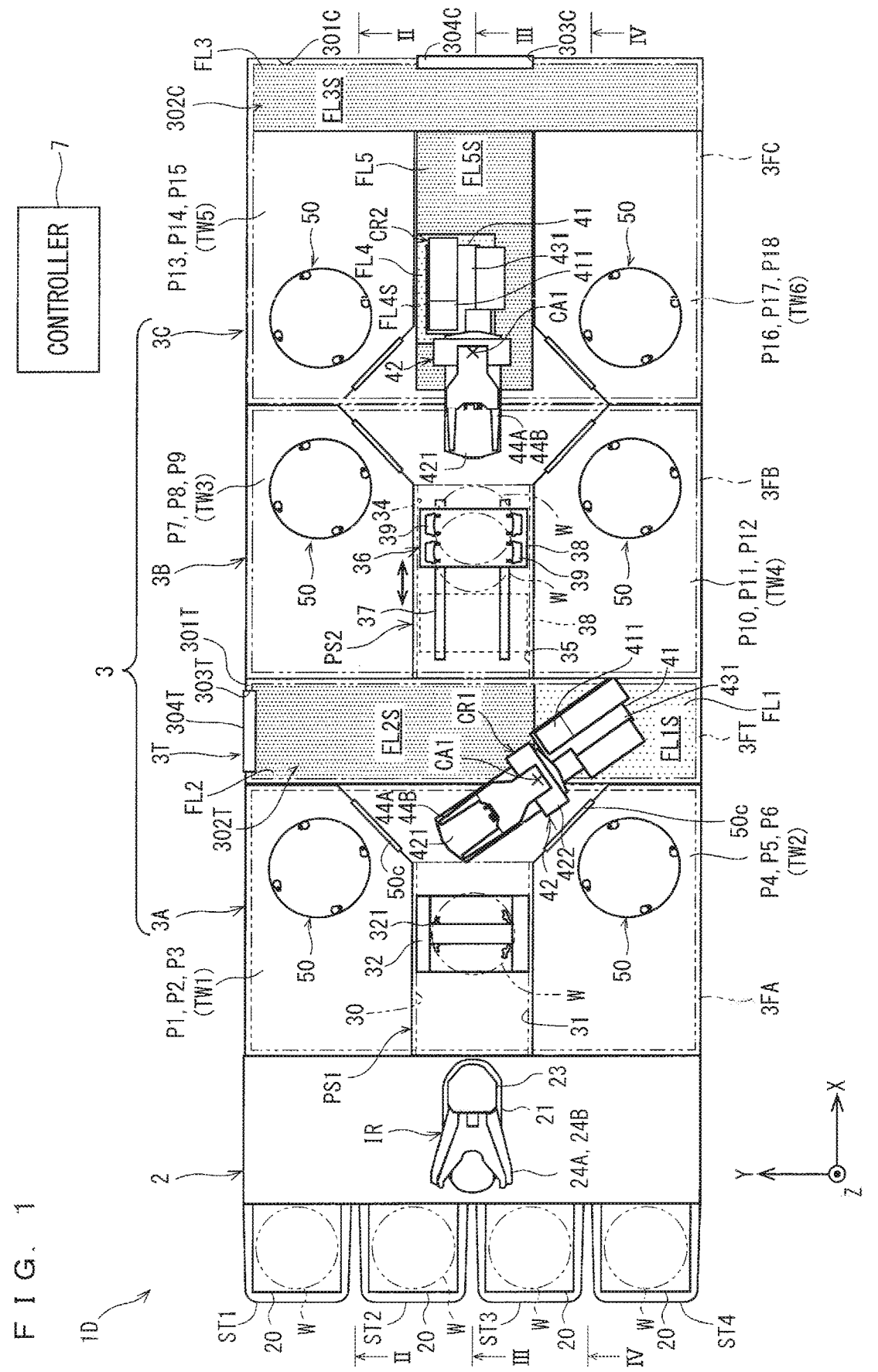
FIG. 1 is a schematic plan view for explaining an internal layout of a substrate processing apparatus 1 according to a preferred embodiment.

Hereinafter, a preferred embodiment of the present invention will be described with reference to the accompanying drawings. In addition, components described in the present preferred embodiment are mere illustrations and are not intended to limit the scope of the present invention only thereto. In the drawings, the size and number of each part may be exaggerated or simplified as needed to facilitate understanding. In each of the drawings, a right-handed XYZ orthogonal coordinate system is defined in order to explain a positional relationship of each element. Here, it is assumed that the X-axis and the Y-axis extend in the horizontal direction, and the Z-axis extends in the vertical direction. In the following description, a direction in which the tip of an arrow faces is defined as a +(plus) direction, and the opposite direction is defined as a −(minus) direction. Here, upward in the vertical direction is a +Z direction, and downward in the vertical direction is a −Z direction.

Unless otherwise specified, expressions that indicate a relative or absolute positional relationship (e.g., "in one direction," "along one direction," "parallel," "orthogonal," "center," "concentric," "coaxial," etc.) not only precisely represent the positional relationship, but also represent the state of relative displacement with respect to an angle or a distance within a range where a tolerance or a similar function can be obtained. Unless otherwise specified, expressions indicating equal states (e.g., "same," "equal," "homogeneous," etc.) not only represent a state that is precisely and quantitatively equal, but also represent a state in which there is a difference where tolerances or similar functions are obtained. Unless otherwise specified, expressions indicating the shape (e.g., "square shape" or "cylindrical shape," etc.) not only represent the shape geometrically and precisely, but also represent a shape having unevenness, chamfering, or the like within a range where similar effects can be obtained. Expressions of "comprising," "being provided with," "including," or "having" one component is not an exclusive expression excluding the presence of other components. Unless otherwise specified, "on . . . " may refer to not only a case where two elements are in contact but also a case where two elements are separated. Unless otherwise specified, "moving . . . in a specific direction" may refer to moving . . . in parallel to the specific direction, but also moving . . . in a direction having a component in the specific direction.

1. Preferred Embodiment

Figure 2:
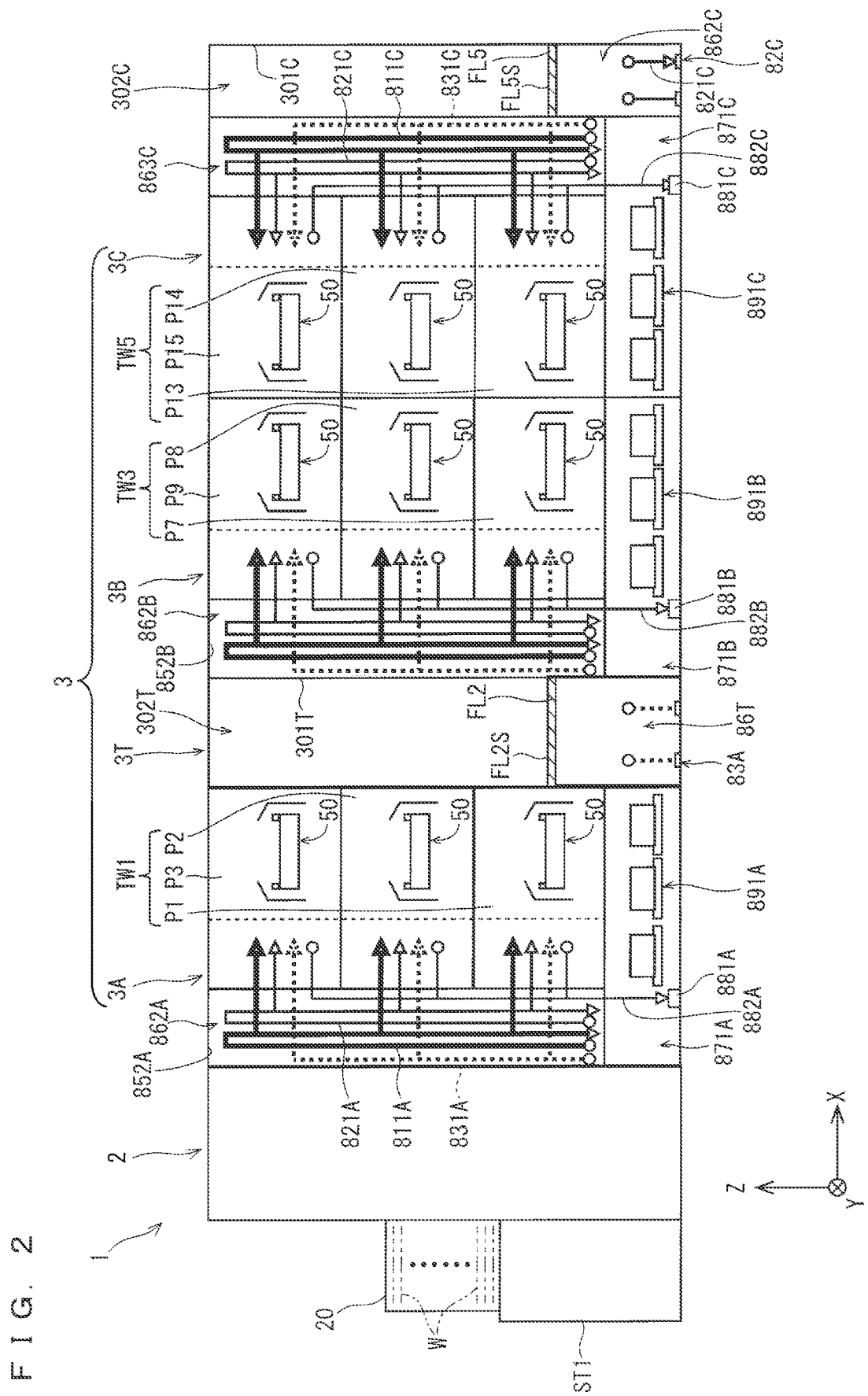
FIG. 2 is a schematic side sectional view illustrating the inside of the substrate processing apparatus 1 at a position along line II-II illustrated in FIG. 1.
Figure 3:
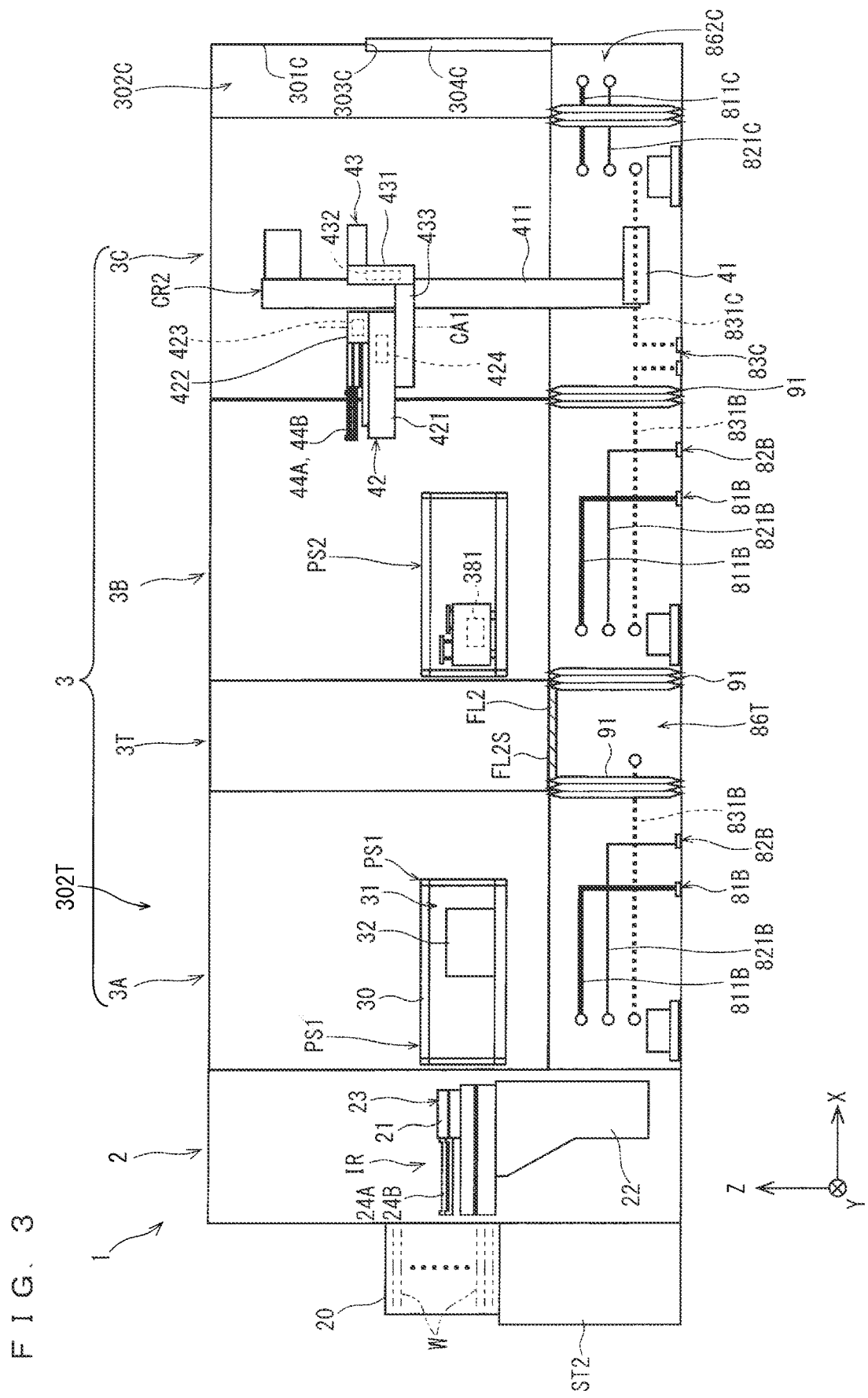
FIG. 3 is a schematic side sectional view illustrating the inside of the substrate processing apparatus 1 at a position along line illustrated in FIG. 1.
Figure 4:
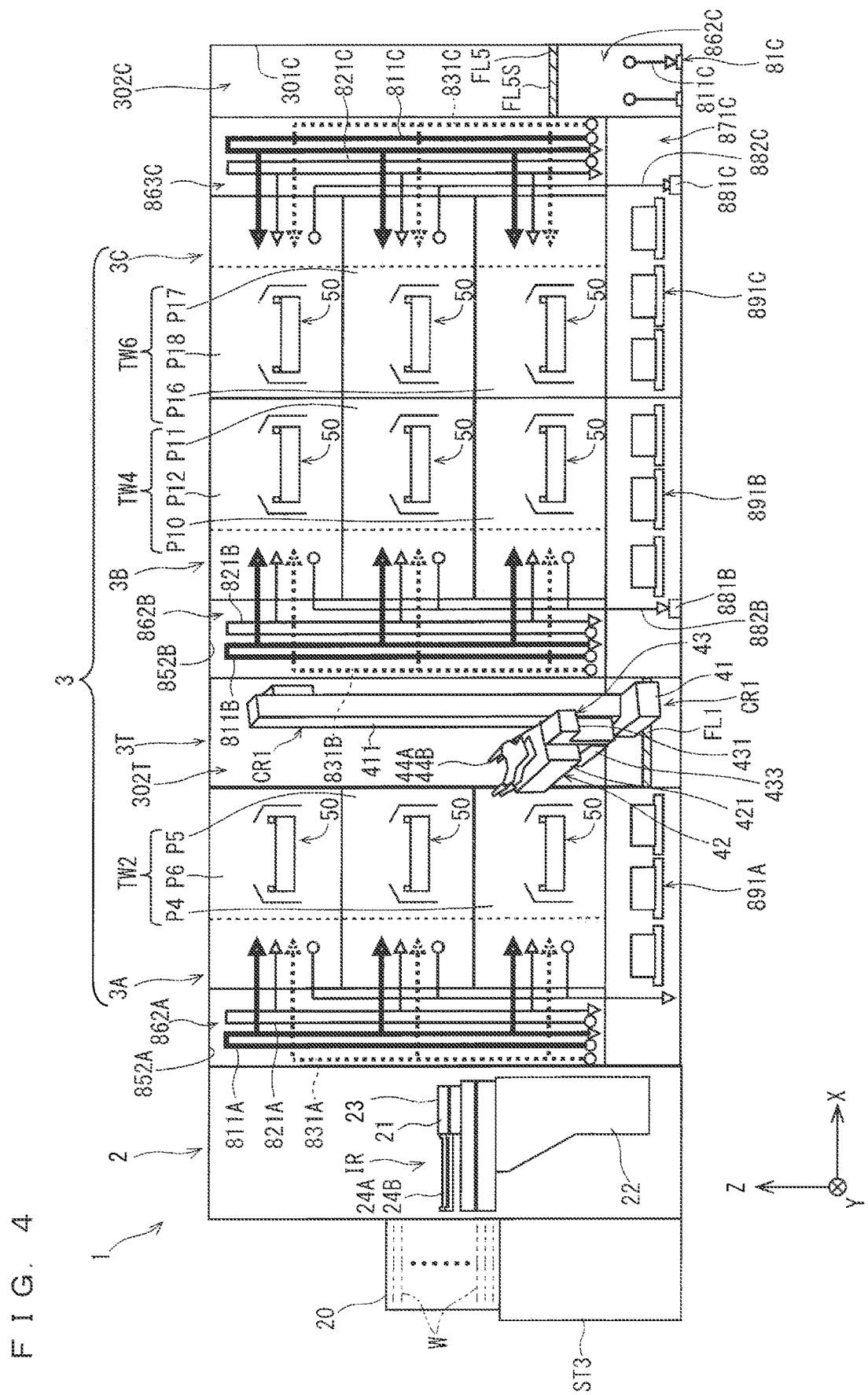
FIG. 4 is a schematic side sectional view illustrating the inside of the substrate processing apparatus 1 at a position along line IV-IV illustrated in FIG. 1.

FIG. 1 is a schematic plan view for explaining an internal layout of a substrate processing apparatus 1 according to the preferred embodiment. FIG. 2 is a schematic side sectional view illustrating the inside of the substrate processing apparatus 1 at a position along line II-II illustrated in FIG. 1. FIG. 3 is a schematic side sectional view illustrating the inside of the substrate processing apparatus 1 at a position along line illustrated in FIG. 1. FIG. 4 is a schematic side sectional view illustrating the inside of the substrate processing apparatus 1 at a position along line IV-IV illustrated in FIG. 1.

The substrate processing apparatus 1 is a single wafer processing apparatus that processes a disk-shaped substrate W such as a semiconductor wafer one by one. The substrate processing apparatus 1 performs various kinds of processing such as cleaning or etching on the substrate W. As illustrated in FIG. 1, the substrate processing apparatus 1 includes an indexer section 2 (substrate supply part) and a processing section 3 in order toward the +X side.

The processing section 3 includes a first processing module 3A, a transfer module 3T, a second processing module 3B, and a third processing module 3C in order toward the +X side. The first processing module 3A and the transfer module 3T are coupled, and the transfer module 3T and the second processing module 3B are coupled using respective couplers (not illustrated) in a couplable and de-couplable manner. That is, the first processing module 3A, the transfer module 3T, and the second processing module 3B can be separated from each other by releasing the couplers (not illustrated). The first processing module 3A and the transfer module 3T are examples of coupling modules provided in the substrate processing apparatus 1.

The first processing module 3A includes a first delivery part PS1, and the indexer section 2 supplies the substrate W to the first delivery part PS1. The indexer section 2 is an example of the substrate supply part. The processing section 3 includes liquid processing units P1 to P18 that perform specified processing on one unprocessed substrate W supplied to the first delivery part PS1. The specified processing may include various processes such as a fluid process using a processing liquid or gas, a process using electromagnetic waves such as ultraviolet rays, and a physical cleaning process (brush cleaning, spray nozzle cleaning, etc.). The indexer section 2 receives the substrate W having completed the process in the processing section 3 from the first delivery part PS1.

The indexer section 2 includes a plurality of (here, four) stages ST1 to ST4 and an indexer robot 21. The stages ST1 to ST4 are substrate container holders that can respectively hold substrate containers 20 each storing a plurality of substrates W in a stacked state. The substrate container 20 may be a front opening unified pod (FOUP) that stores the substrate W in a sealed state, a standard mechanical interface (SMIF) pod, an open cassette (OC), or the like. For example, when the substrate container 20 is placed on each of the stages ST1 to ST4, the substrate container 20 is in a state where a plurality of horizontal substrates W are stacked while spaced from each other in the vertical direction.

The indexer robot 21 includes, for example, a base portion 22, an articulated arm 23, and two hands 24A, 24B provided while spaced in the vertical direction. The base portion 22 is fixed to a frame that defines the outer shape of the indexer section 2 of the substrate processing apparatus 1, for example. The articulated arm 23 is configured by coupling a plurality of arm portions, which can rotate along a horizontal plane, in a mutually rotatable manner. The articulated arm 23 is configured to bend and stretch by changing an angle between the arm portions with a joint which is a coupling place for the arm portions. The base end of the articulated arm 23 is coupled to the base portion 22 so as to be able to rotate around a vertical axis. Further, the articulated arm 23 is coupled to the base portion 22 so as to be lifted or lowered. In other words, the base portion 22 incorporates a lifting drive mechanism for moving the articulated arm 23 up and down and a rotational drive mechanism for rotating the articulated arm 23 around the vertical axis. Further, the articulated arm 23 is provided with an individual rotational drive mechanism for independently rotating each arm portion. The hands 24A, 24B are coupled to the tip of the articulated arm 23 so that individual rotation around the vertical axis and individual advance and retreat in the horizontal direction are possible. The articulated arm 23 includes a hand rotational drive mechanism for individually rotating the hands 24A, 24B around the vertical axis, and a hand advance and retreat mechanism for individually advancing and retracting the hands 24A, 24B in the horizontal direction. The hands 24A, 24B are configured to be able to hold a single substrate W, respectively.

The indexer robot 21 operates to unload one unprocessed substrate W from the substrate container 20 held on any of the stages ST1 to ST4 with the hand 24A and passes the substrate to the first delivery part PS1 from the −X side (first direction side) Further, the indexer robot 21 operates to receive one processed substrate W from the first delivery part PS1 with the hand 24B and store the substrate into the substrate container 20 held on any of the stages ST1 to ST4.

<Processing Section 3>

The first processing module 3A of the processing section 3 includes a first delivery part PS1 that temporarily holds the substrate W supplied from the indexer section 2, and the liquid processing units P1 to P6 (first specified processing unit) that perform specified processing on the substrate W. The first processing module 3A includes a frame 3FA that forms an outer frame corresponding to each side of a rectangular parallelepiped, and the first delivery part PS1 and the liquid processing units P1 to P6 are fixed to the frame 3FA. The frame 3FA is a member that defines the outer shape of the first processing module 3A.

The first delivery part PS1 is provided at the center in the Y-axis direction of the frame 3FA of the first processing module 3A. The first delivery part PS1 holds the substrate W loaded by the indexer robot 21 from the −X side. The liquid processing units P1 to P3 are disposed on the +Y side of the first delivery part PS1, and the liquid processing units P4 to P6 are disposed on the −Y side of the first delivery part PS1. The liquid processing units P1-P3 and the liquid processing units P4-P6 are respectively stacked sequentially in the +Z direction and constitute processing towers TW1, TW2.

The transfer module 3T is disposed adjacent to the +X side (second direction side) of the first processing module 3A. Inside the transfer module 3T, a first transfer robot CR1 (first transfer apparatus) is provided. The first transfer robot CR1 unloads the substrate out of the first delivery part PS1 to the +X side and loads the substrate W into any of the liquid processing units P1 to P6 from the +X side. The first transfer robot CR1 unloads the substrate W processed in the liquid processing units P1 to P6 and loads the substrate W into the first delivery part PS1 from the +X side.

The first delivery part PS1 has a cylindrical transfer chamber 31 surrounded by a partition wall 30 on the +Z side, the −Z side, the +Y side, and the −Y side. Inside the transfer chamber 31, a substrate holder 32 for holding the substrate W in a horizontal posture is provided. The substrate holder 32 holds the substrate W with a support 321 that supports the peripheral edge of the substrate W from below, for example. The substrate holder 32 may include a plurality of supports 321 spaced in the vertical direction so that the plurality of substrates W can be simultaneously arranged and held in the vertical direction. In this case, the gap between the vertically arranged substrates W is set to a size that allows the hands 24A, 24B of the indexer robot 21 or the hands 44A, 44B of the first transfer robot CR1 to enter the gap in a horizontal direction and may, for example, be a size with a value larger than the thickness of each of the hands 24A, 24B, 44A, 44B (the width in the vertical direction at the time when the substrate W is held in the horizontal posture).

The substrate holder 32 is provided on the +X side of the center of the transfer chamber 31 in the X-axis direction. That is, the support 321 of the substrate holder 32 is provided at a position closer to the first transfer robot CR1 than the indexer robot 21. By having the articulated arm 23, the indexer robot 21 can move the substrate W more in the horizontal direction than the first transfer robot CR1. For this reason, the indexer robot 21 can load or unload the substrate W into or out of the substrate holder 32 of the first delivery part PS1 from a position farther than the first transfer robot CR1.

The second processing module 3B of the processing section 3 is disposed adjacent to the +X side (second direction side) of the transfer module 3T. The second processing module 3B includes a second delivery part PS2 that temporarily holds the substrate W loaded by the first transfer robot CR1 from the −X side (first direction side), and the liquid processing units P7 to P12 (second specified processing units) that perform specified processing on the substrate W. The second processing module 3B includes a frame 3FB that forms an outer frame corresponding to each side of a rectangular parallelepiped, and the second delivery part PS2 and the liquid processing units P7 to P12 are fixed to the frame 3FB.

The liquid processing units P7 to P9 are provided adjacent to the +Y side of the second delivery part PS2, and the liquid processing units P10 to P12 are provided adjacent to the −Y side of the second delivery part PS2. The liquid processing units P7-P9 and the liquid processing units P10-P12 are respectively stacked sequentially in the +Z direction and constitute processing towers TW3, TW4.

The second delivery part PS2 has a transfer chamber 35 formed of a cylindrical partition wall 34 including a +Z side surface, a −Z side surface, a +Y side surface, and a −Y side surface. The shape and size of the transfer chamber 35 are almost the same as those of the transfer chamber 31. A shuttle transfer apparatus 36 is provided in the transfer chamber 35. The shuttle transfer apparatus 36 reciprocates along the X-axis while holding the substrate W in the horizontal posture. The shuttle transfer apparatus 36 includes a rail 37 extending in the X-axis direction, a shuttle body 38 that moves while being guided by the rail 37, a movement motor 381 that reciprocates the shuttle body 38 in the X-axis direction, and two substrate holders 39 that is provided on the upper surface of the shuttle body 38 and hold the substrate W in the horizontal posture. The two substrate holders 39 hold the substrates W at different heights in the Z-axis direction, respectively. As described above, the shuttle transfer apparatus 36 can simultaneously hold and transfer two substrates W in the X-axis direction.

In the second delivery part PS2, the shuttle transfer apparatus 36 can transfer the substrate W between the −X side position close to the first transfer robot CR1 and the +X side position close to the second transfer robot CR2 (second transfer apparatus). For this reason, even when an amount of movement of the substrate W in the horizontal direction made by the transfer robots CR1, CR2 is smaller than that of the indexer robot 21, the substrate W can be transferred between the transfer robots CR1, CR2.

The third processing module 3C of the processing section 3 is disposed adjacent to the +X side (second direction side) of the second processing module 3B. The third processing module 3C includes a second transfer robot CR2 and liquid processing units P13 to P18 (third specified processing units). The third processing module 3C includes a frame 3FC that forms an outer frame corresponding to each side of a rectangular parallelepiped, and the second transfer robot CR2 and the liquid processing units P13 to P18 are fixed to the frame 3FC.

The second transfer robot CR2 is provided at the center in the Y-axis direction of the third processing module 3C. The liquid processing units P13 to P15 are provided on the +Y side of the second transfer robot CR2, and the liquid processing units P16 to P18 are provided on the −Y side of the second transfer robot CR2. The liquid processing units P13-P15 and the liquid processing units P16-P18 are respectively stacked sequentially in the +Z direction and constitute processing towers TW5, TW6.

The first transfer robot CR1 and the second transfer robot CR2 have the same configuration. Hereinafter, the configuration of the first transfer robot CR1 will be described. It is not essential that the transfer robots CR1, CR2 have the same configuration.

The first transfer robot CR1 includes a base portion 41, a horizontal actuator 42, a vertical drive part 43, and the two hands 44A, 44B. A support rod 411 extending in the vertical direction is erected on the upper surface of the base portion 41. The base portion 41 of the first transfer robot CR1 is attached to the transfer module 3T. Here, the base portion 41 is provided on a plate-like first floor FL1 provided in the transfer module 3T. The first floor FL1 is attached to a frame 3FT via a bolt or the like on the −Y side in the transfer module 3T. The frame 3FT has an outer frame corresponding to each side of a rectangular parallelepiped and is a member that defines the outer shape of the transfer module 3T. The first floor FL1 is provided at a position between the processing towers TW2 and TW4 and is located on the −Y side from the first delivery part PS1. That is, the base portion 41 of the first transfer robot CR1 is provided on the −Y side with respect to the first delivery part PS1. The base portion 41 of the second transfer robot CR2 is fixed to the third processing module 3C (specifically, a fourth floor FL4 described later).

The horizontal actuator 42 moves the hands 44A, 44B in the horizontal direction. The horizontal actuator 42 includes a stage 421, a horizontal slider 422 that reciprocates in the horizontal direction, and a horizontal motor 423 that moves the horizontal slider 422. A linearly extending rail (not illustrated) is provided on the upper surface of the stage 421, and the moving direction of the horizontal slider 422 is regulated by the rail. The movement of the horizontal slider 422 is realized by a known mechanism such as a linear motor mechanism or a ball screw mechanism. The two hands 44A, 44B are provided at the tip of the horizontal slider 422. By the horizontal motor 423 moving the horizontal slider 422 along the rail, the hands 44A, 44B can advance and retreat in the horizontal direction. In other words, the horizontal actuator 42 moves the hands 44A, 44B in the direction of horizontally separating from and approaching the base portion 41 and the support rod 411.

The horizontal actuator 42 includes a rotation motor 424 that rotates the stage 421 around a rotation axis CA1 along the vertical direction. The rotation motor 424 enables the hands 44A, 44B to rotate around the rotation axis CA1 within a range not interfering with the support rod 411.

The vertical actuator 43 includes a vertical slider 431, a vertical motor 432, and a coupler 433. The vertical slider 431 is engaged with a rail (not illustrated) provided on the support rod 411 and extending in the vertical direction. The vertical motor 432 reciprocates the vertical slider 431 along the rail in the vertical direction. The vertical motor 432 is provided on the base portion 41, for example. The movement of the vertical slider 431 is realized by a known mechanism such as a linear motor mechanism or a ball screw mechanism. The coupler 433 couples the vertical slider 431 and the stage 421, and supports the stage 421 from below. By the vertical motor 432 moving the vertical slider 431, the stage 421 moves in the vertical direction. As a result, the hands 44A, 44B can move up and down in the vertical direction.

It is not essential for the horizontal actuator 42 to move the hands 44A, 44B in parallel with the horizontal direction, and the horizontal actuator 42 may move the hands 44A, 44B in a combined direction of the horizontal direction and the vertical direction. That is, "moving . . . in the horizontal direction" means moving . . . in a direction having a horizontal component. Similarly, it is not essential for the vertical actuator 43 to move the hands 44A, 44B in parallel with the vertical direction, and the vertical actuator 43 may move the hands 44A, 44B in a combined direction of the vertical direction and the horizontal direction. That is, "moving . . . in the vertical direction" means moving . . . in a direction having a component in the vertical direction.

Figure 5:
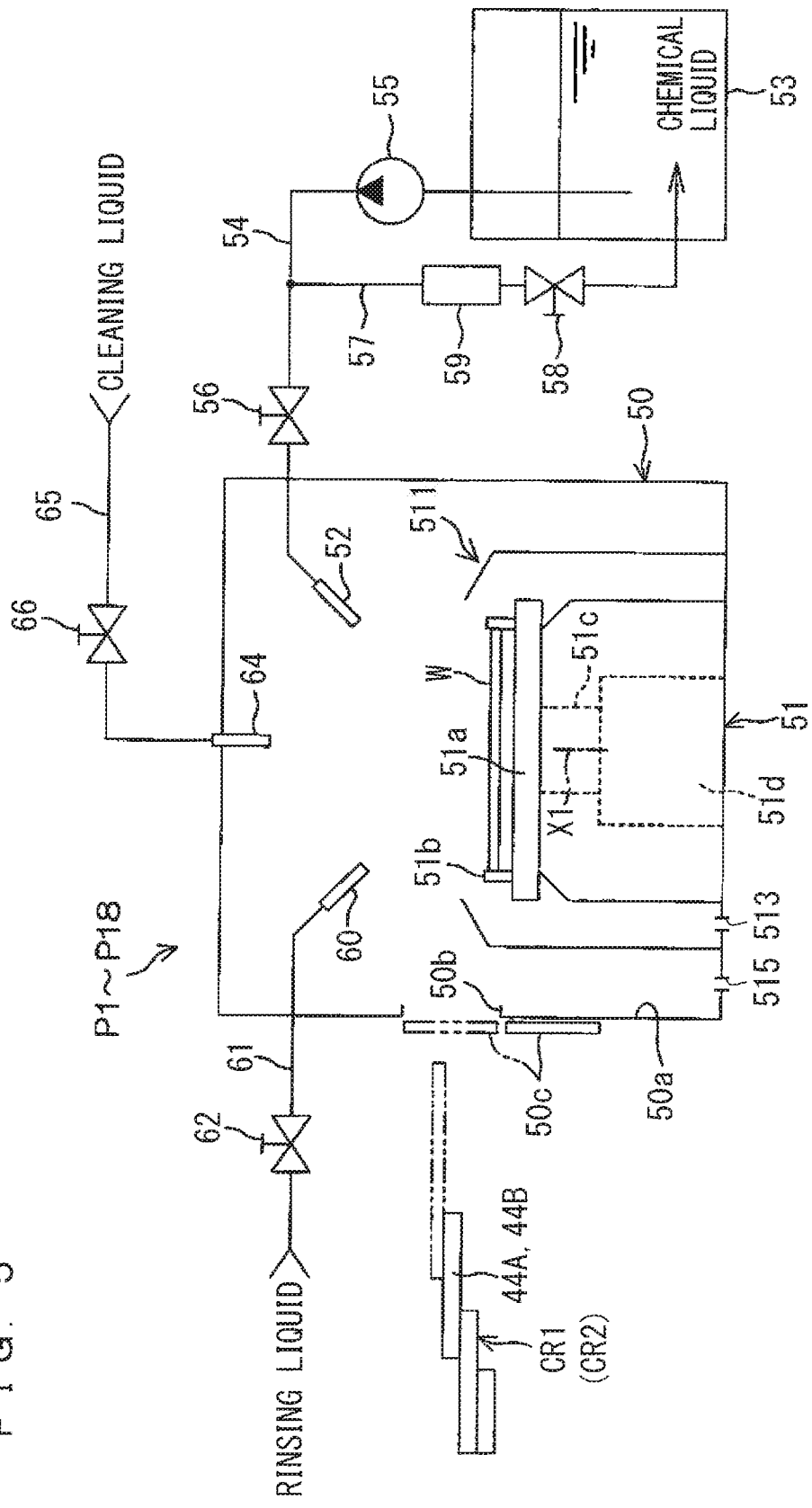
FIG. 5 is a pattern view of the inside of liquid processing units P1 to P18 provided in the substrate processing apparatus 1 as viewed in the horizontal direction.

FIG. 5 is a pattern view of the inside of the liquid processing units P1 to P18 provided in the substrate processing apparatus 1 as viewed in the horizontal direction. Each of the liquid processing units P1 to P18 includes a box-shaped processing chamber 50 having an internal space, a spin chuck 51 that rotates a single substrate W around a vertical rotating axis X1 passing through the central portion of the substrate W while holding the substrate W in the horizontal posture in the processing chamber 50, and a cylindrical processing cup 511 that surrounds the spin chuck 51 around the rotating axis X1 of the substrate W.

The processing chamber 50 is surrounded by a box-shaped partition wall 50a. In the partition wall 50a, an opening 50b for loading or unloading the substrate W into or from the processing chamber 50 is formed. The opening 50b is opened and closed by a shutter 50c. The shutter 50c is lifted or lowered between a closed position (indicated by a two-dot chain line in FIG. 5) that covers the opening 50b by a shutter lifting mechanism (not illustrated) and an open position (indicated by a solid line in FIG. 5) that opens the opening 50b.

At the time of loading or unloading the substrate W, the transfer robot CR1 or CR2 accesses the hands 44A, 44B into the processing chamber 50 through the opening 50b. Thereby, an unprocessed substrate W can be placed on the spin chuck 51, or the processed substrate W can be removed from the spin chuck 51.

As illustrated in FIG. 5, the spin chuck 51 includes a disc-shaped spin base 51a taking a horizontal posture, a plurality of chuck pins 51b protruding upward from the outer peripheral portion of the upper surface of the spin base 51a, a chuck opening/closing mechanism that presses the plurality of chuck pins 51b into the peripheral edge of the substrate W, a rotating shaft 51c extending downward from the central portion of the spin base 51a, and a spin motor 51d that rotates the rotating shaft 51c to rotate the substrate W held by the plurality of chuck pins 51b. The spin chuck 51 is not limited to the clamping chuck illustrated in FIG. 5 but may be a vacuum chuck that holds the substrate in a horizontal posture by attracting the lower surface of the substrate to the upper surface of the spin base.

As illustrated in FIG. 5, each of the liquid processing units P1 to P18 includes a chemical liquid nozzle 52 that discharges a chemical liquid toward the upper surface of the substrate W held by the spin chuck 51, a chemical liquid tank 53 that reserves the chemical liquid to be supplied to the chemical liquid nozzle 52, a chemical liquid pipe 54 that leads the chemical liquid in the chemical liquid tank 53 to the chemical liquid nozzle 52, a liquid feeding apparatus 55 (e.g., a pump) that feeds the chemical liquid in the chemical liquid tank 53 to the chemical liquid pipe 54, and a chemical liquid valve 56 that opens and closes the inside of the chemical liquid pipe 54. Each of the liquid processing units P1 to P18 further includes a circulation pipe 57 that connects the chemical liquid pipe 54 and the chemical liquid tank 53 upstream of the chemical liquid valve 56 (chemical liquid tank 53 side), a circulation valve 58 that opens and closes the inside of the circulation pipe 57, and a temperature adjustment apparatus 59 that adjusts the temperature of the chemical liquid flowing through the circulation pipe 57.

Figure 6:
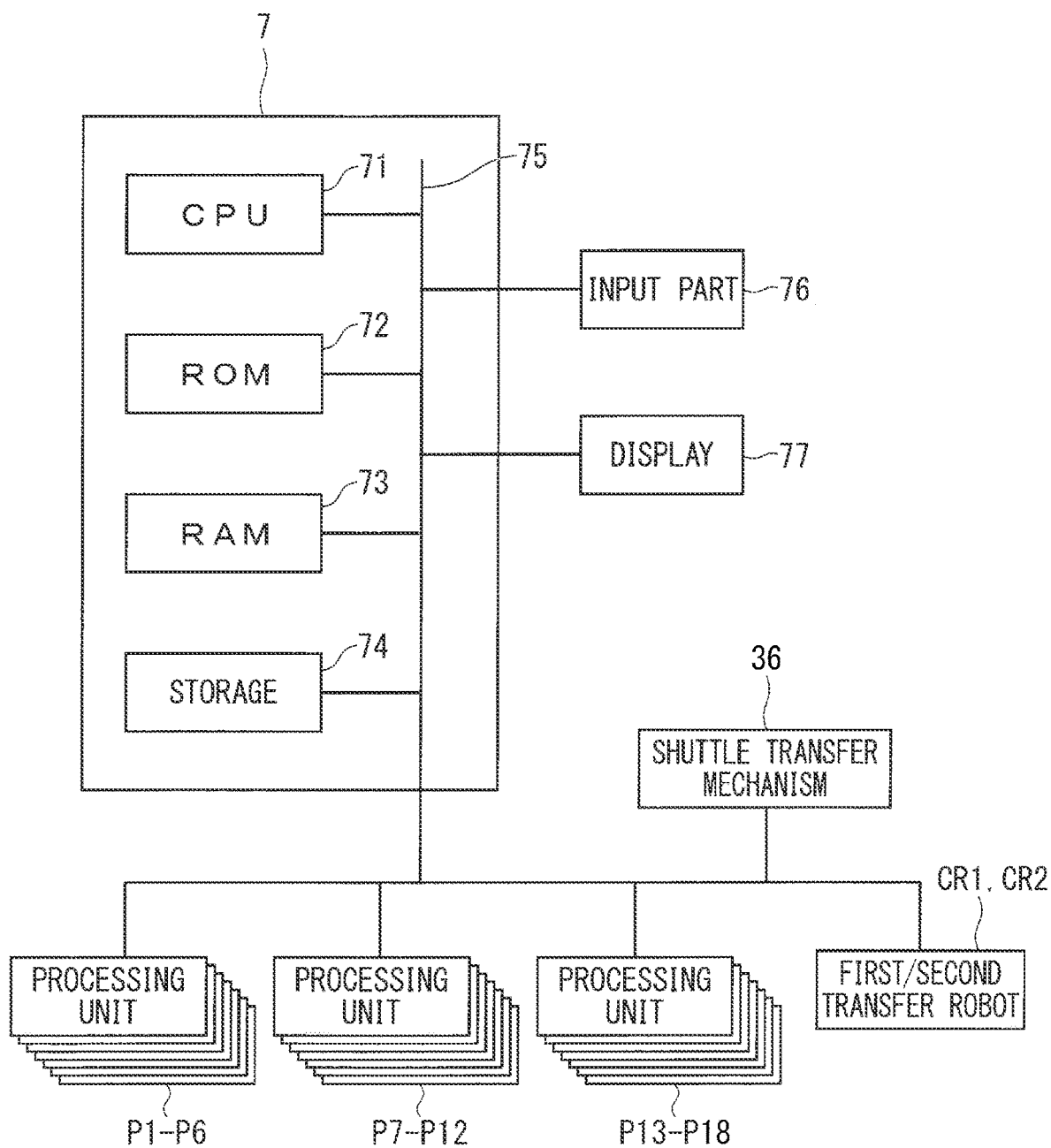
FIG. 6 is a block diagram illustrating the connection between each element of the substrate processing apparatus 1 and a controller 7.

The opening and closing of the chemical liquid valve 56 and the circulation valve 58 are controlled by the controller 7 (see FIG. 6). At the time of supplying the chemical liquid in the chemical liquid tank 53 to the chemical liquid nozzle 52, the chemical liquid valve 56 is opened and the circulation valve 58 is closed. In this state, the chemical liquid fed from the chemical liquid tank 53 to the chemical liquid pipe 54 by the liquid feeding apparatus 55 is supplied to the chemical liquid nozzle 52. On the other hand, when the supply of the chemical liquid to the chemical liquid nozzle 52 is stopped, the chemical liquid valve 56 is closed and the circulation valve 58 is opened. In this state, the chemical liquid fed from the chemical liquid tank 53 to the chemical liquid pipe 54 by the liquid feeding apparatus 55 returns to the chemical liquid tank 53 through the circulation pipe 57. Therefore, during the stoppage of supply where the supply of the chemical liquid to the chemical liquid nozzle 52 is stopped, the chemical liquid continues to circulate through a circulation path made up of the chemical liquid tank 53, the chemical liquid pipe 54, and the circulation pipe 57. The temperature adjustment apparatus 59 adjusts the temperature of the chemical liquid flowing through the circulation pipe 57. Hence the chemical liquid in the chemical liquid tank 53 is heated in the circulation path during the stoppage of supply, and is kept at a temperature higher than room temperature.

Further, the opening degree of the chemical liquid valve 56 can be adjusted so that a small amount of chemical liquid can be discharged from the chemical liquid nozzle 52 to perform pre-dispensing. Further, a chemical recovery member (not illustrated) is disposed in the vicinity of the chemical liquid nozzle 52 so that the pre-dispensed chemical liquid can be recovered from the chemical liquid nozzle 52.

Moreover, as illustrated in FIG. 5, each of the liquid processing units P1 to P18 includes a rinsing liquid nozzle 60 that discharges a rinsing liquid toward the upper surface of the substrate W held by the spin chuck 51, a rinsing liquid pipe 61 that supplies the rinsing liquid from a rinsing liquid supply source (not illustrated) to the rinsing liquid nozzle 60, and a rinsing liquid valve 62 that switches the supply and the stoppage of supply of the rinsing liquid from the rinsing liquid pipe 61 to the rinsing liquid nozzle 60. As the rinsing liquid, deionized water (DIW) or the like is used. After the chemical liquid is supplied to the substrate W by the chemical liquid nozzle 52, the rinse liquid is supplied from the rinsing liquid nozzle 60 to the substrate W, whereby the chemical liquid adhering to the substrate W can be washed away.

Further, each of the liquid processing units P1 to P18 includes a cleaning liquid nozzle 64 that discharges a cleaning liquid toward a predetermined portion (e.g., spin base 51a) inside the processing chamber 50, a cleaning liquid pipe 65 that supplies the cleaning liquid from a cleaning liquid supply source (not illustrated) to the cleaning liquid nozzle 64, and a cleaning liquid valve 66 that switches the supply and the stoppage of supply of the cleaning liquid from the cleaning liquid pipe 65 to the cleaning liquid nozzle 64. The DIW or the like is used as the cleaning liquid. The cleaning liquid nozzle 64 is attached to the inner wall of the processing chamber 50. While a dummy substrate (cleaning jig, not illustrated) or the substrate W is held by the plurality of chuck pins 51b, the spin base 51a and the chuck pin 51b are rotated, and the cleaning liquid is discharged from the cleaning liquid nozzle 64. The cleaning liquid discharged from the cleaning liquid nozzle 64 rebounds on the upper surface of the dummy substrate or the upper surface of the substrate W, held by the chuck pins 51b, and the cleaning liquid splatters in the processing chamber 50. By splattering the cleaning liquid in this manner, various components (chuck pins 51b and processing cup 511) disposed in the processing chamber 50 can be cleaned.

The processing cup 511 is provided so as to surround the periphery of the spin chuck 51 and is lifted or lowered in the vertical direction by a motor (not illustrated). The upper portion of the processing cup 511 is lifted or lowered between an upper position with its upper end being above the substrate W held by the chuck pins 51b and a lower position being lower than the height of the substrate W. A processing liquid splattered outward from the upper surface of the substrate W is received by the inner surface of the processing cup 511. The processing liquid received by the processing cup 511 is appropriately drained to the outside of the processing chamber 50 through a drainage port 513 provided at the bottom of the processing chamber 50 and inside the processing cup 511. Further, an exhaust port 515 is provided on the side of the processing chamber 50. The atmosphere in the processing chamber 50 is appropriately discharged out of the processing chamber 50 through the exhaust port 515.

FIG. 6 is a block diagram illustrating the connection between each element of the substrate processing apparatus 1 and the controller 7. The hardware configuration of the controller 7 is similar to that of a general computer. That is, the controller 7 includes a central processing unit (CPU) 71 that performs various kinds of arithmetic processing, a read-only memory (ROM) 72 that is a read-only memory for storing basic programs, a random-access memory (RAM) 73 that is a readable and writable memory that stores various pieces of information, and a non-transitory storage 74 for storing a control application (program), data, or the like. The CPU 71, the ROM 72, the RAM 73, and the storage 74 are connected to each other with bus wiring 75.

The control application or the data may be provided to the controller 7 while being recorded on a non-transitory recording medium (semiconductor memory, optical medium, magnetic medium, etc.). In this case, a reader that reads a control application or the data from the recording medium may be connected to the bus wiring 75. The control application or the data may be provided from the server or the like to the controller 7 via a network. In this case, a communication part that performs network communication with an external apparatus may be connected to the bus wiring 75.

An input part 76 and a display 77 are connected to the bus wiring 75. The input part 76 includes various input devices such as a keyboard and a mouse. The operator inputs various pieces of information to the controller 7 via the input part 76. The display 77 includes a display device such as a liquid crystal monitor and displays various pieces of information.

The controller 7 is connected to operation parts (valves 56, 58, 62, 66, shutter 50c, spin motor 51d, etc.) of each of the liquid processing units P1 to P18, operation parts (movement motor 381, etc.) of the shuttle transfer apparatus 36, and operation parts (horizontal motor 423, rotation motor 424, vertical motor 432, etc.) of each of the transfer robots CR1, CR2, and the controller 7 controls those operations.

Figure 7:
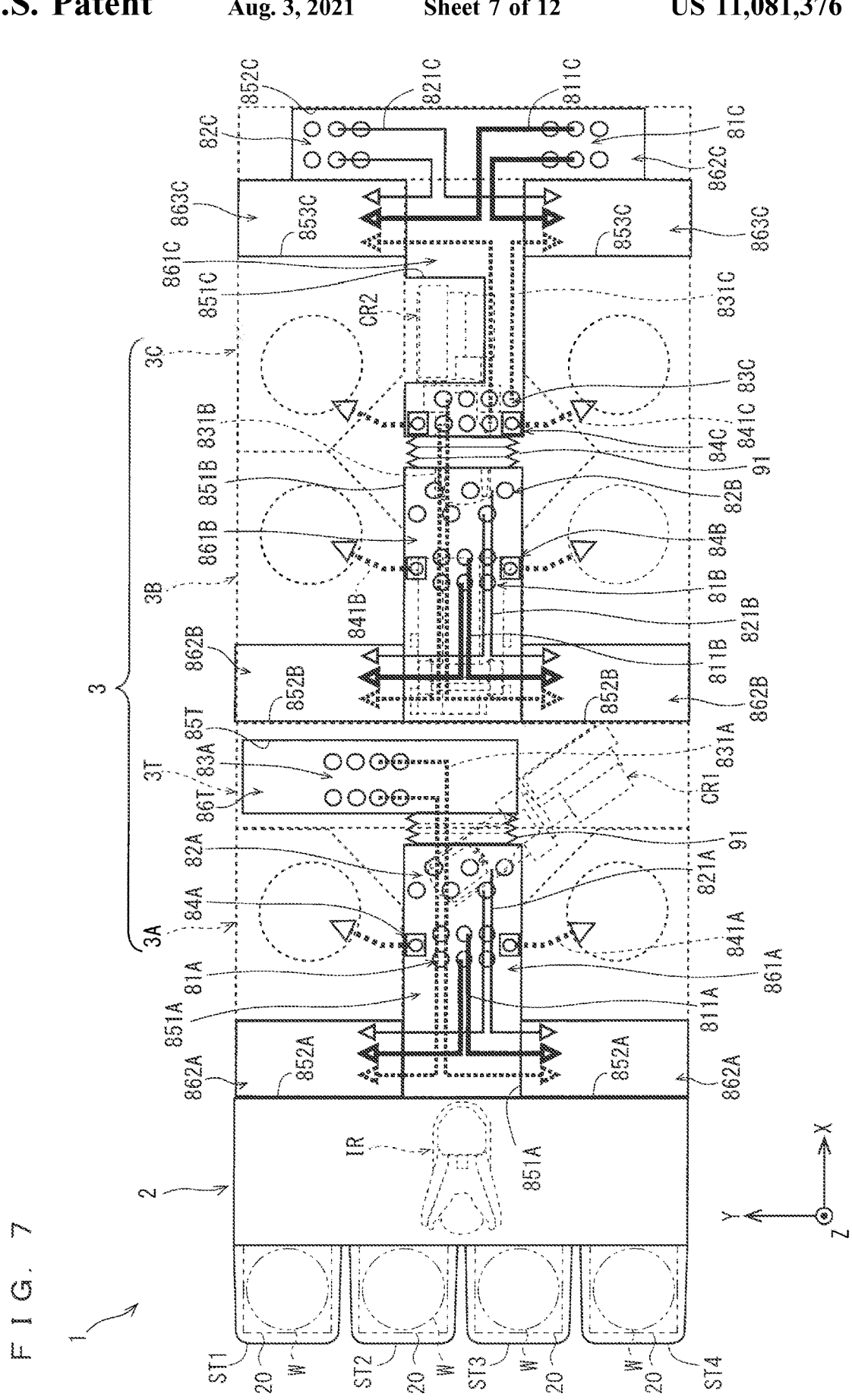
FIG. 7 is a schematic plan view for explaining the arrangement of pipes for supplying fluid to each of the liquid processing units P1 to P18.

FIG. 7 is a schematic plan view for explaining the arrangement of pipes for supplying fluid to each of the liquid processing units P1 to P18. As illustrated in FIG. 7, the processing section 3 includes a pipe connection port group 81 (81A, 81B, 81C), a pipe connection port group 82 (82A, 82B, 82C), and a pipe connection port group 83 (83A, 83C), and a pipe connection port group 84 (84A, 84B, 84C), each group being made up of a plurality of connection ports. Specifically, the first processing module 3A is provided with the pipe connection port groups 81A, 82A, 84A, and the transfer module 3T is provided with the pipe connection port group 83A. The second processing module 3B is provided with the pipe connection port groups 81B, 82B, 84B, and the third processing module 3C is provided with the pipe connection port groups 81C, 82C, 83C, 84C.

The pipe connection port groups 81 to 84 are connected to a pipe for fluid supplied from the outside of the substrate processing apparatus 1. By connecting pipes linked to the liquid processing units P1 to P18 to the pipe connection port groups 81 to 84, the processing liquid is supplied to the liquid processing units P1 to P18.

A piping chamber 861A surrounded by a partition wall 851A is provided below the frame 3FA of the first processing module 3A. A piping chamber 86T surrounded by a partition wall 85T is provided below the frame 3FT of the transfer module 3T. The partition walls 851A, 85T are attached to the frames 3FA, 3FT, respectively.

The piping chamber 861A has a rectangular parallelepiped shape extending in the X direction at the center in the Y-axis direction of the first processing module 3A and is provided below the first delivery part PS1 of the first processing module 3A. The piping chamber 86T is provided on the +Y side of the transfer module 3T, and the top of the piping chamber 86T is covered with a plate-like second floor FL2. The second floor FL2 is attached to the frame 3FT via bolts or the like. The second floor FL2 is provided adjacent to the +Y side (third direction side) of the first floor FL1. The second floor FL2 extends in the Y-axis direction from the +Y side end portion of the first floor FL1 to the +Y side end portion of the frame 3FT. As described above, the base portion 41 of the first transfer robot CR1 is installed on the first floor FL1. That is, the inside of the frame 3FT is an example of a placement space where the first transfer robot CR1 (first transfer apparatus) is placed.

An upper surface FL2S of the second floor FL2 is at a position lower than an upper surface FL1S of the first floor FL1. In this case, when the first transfer robot CR1 is installed on the upper surface FL1S, the lower end of the first transfer robot CR1 can be disposed at a position lower than the upper surface FL2S. Therefore, the first transfer robot CR1 can transfer the substrate W also to the processing unit (e.g., liquid processing units P1, P4) disposed at a low position.

The transfer module 3T has a maintenance chamber 302T surrounded by a partition wall 301T. The partition wall 301T is attached to the frame 3FT. The maintenance chamber 302T has a rectangular parallelepiped shape and is provided between the processing tower TW1 of the first processing module 3A and the processing tower TW3 of the second processing module 3B. Further, the processing tower TW1 is provided between the transfer chamber 31 of the first delivery part PS1 and the transfer chamber 35 of the second delivery part PS2. A gateway 303T is provided on the +Y side portion of the partition wall 301T of the maintenance chamber 302T. The gateway 303T is provided on the +Y side (third direction side) of the second floor FL2. The maintenance chamber 302T has an opening that communicates the inside of the maintenance chamber 302T with the outside of the maintenance chamber 302T (frame 3FT), and the opening has a size that enables a person to pass through the inside. On the +Y side of the partition wall 301T, a door 304T for opening and closing the gateway 303T is provided. The lower end of the opening of the gateway 303T and the upper surface FL2S of the second floor FL2 have, for example, substantially the same height.

The operator can enter the maintenance chamber 302T by manually opening the door 304T and passing through the inside of the gateway 303T. In addition, the operator can approach the first transfer robot CR1 by stepping on the upper surface FL2S of the second floor FL2 and proceeding in the −Y direction, and the operator can thus perform the maintenance of the first transfer robot CR1. Further, since the top of the piping chamber 86T is covered with the second floor FL2, the operator can approach the first transfer robot CR1 without stepping on the pipe connection port group 83A provided in the piping chamber 86T or the pipe 831A (supply pipe) connected thereto.

At the center in the Y-axis direction of the +X side portion of the maintenance chamber 302T, an opening corresponding to a −X side transfer port of the transfer chamber 35 of the second delivery part PS2 is formed. The first transfer robot CR1 loads the substrate W into the second delivery part PS2 of the second processing module 3B through the opening and unloads the substrate W out of the second delivery part PS2. In addition, there is no partition wall 301T above the second floor FL2 and the first floor FL1 in the −X side portion of the maintenance chamber 302T, and the inside of the maintenance chamber 302T communicates with the internal space of the first processing module 3A. Thus, due to the absence of the partition wall 301T, the first transfer robot CR1 can transfer the substrate W to each of the liquid processing units P1 to P6 in the processing towers TW1, TW2.

Since the transfer chamber 31 of the first delivery part PS1 and the transfer chamber 35 of the second delivery part PS2 are open toward the maintenance chamber 302T, the operator can perform the maintenance of equipment in the second processing module 3B, such as the shuttle transfer apparatus 36, directly from the maintenance chamber 302T. The operator can also unload removable equipment such as the shuttle transfer apparatus 36 to the outside of the substrate processing apparatus 1 via the maintenance chamber 302T. Further, the operator can also check the internal conditions of the processing towers TW1 to TW4 of the first processing module 3A and the second processing module 3B through the opening.

The pipe connection port groups 81A, 82A are provided inside the piping chamber 861A of the first processing module 3A. The pipe connection port group 81A is provided near the center in the X-axis direction of the piping chamber 861A, and the pipe connection port group 82A is provided on the +X side of the pipe connection port group 81A.

The pipe connection port group 83A is provided inside the piping chamber 86T of the transfer module 3T. The pipe connection port group 83A is provided closer to the +Y side than the center of the piping chamber 86T. Here, the pipe connection port group 83A is provided below the second floor FL2, and the top of the pipe connection port group 83A is covered with the second floor FL2.

Each of the pipe connection port groups 81A, 82A, 83A is a set of a plurality of pipe connection ports that are independent of each other. Each pipe connection port has a structure capable of connecting one end of a pipe connected to each of the liquid processing units P1 to P18. The respective pipe connection port groups 81A, 82A, 83A are connected to supply sources for a first processing liquid, a second processing liquid, and a third processing liquid, provided outside the substrate processing apparatus 1. The pipe connection port group 81A is connected to the supply source for the first processing liquid that is adjusted to a relatively low temperature, the pipe connection port group 82A is connected to the supply source for the second processing liquid that is adjusted to a relatively high temperature, and the pipe connection port group 83A is connected to the supply source for the third processing liquid.

At least two each of pipes 811A, 821A, 831A are connected to the pipe connection port groups 81A, 82A, 83A, respectively. The pipes 811A, 821A connected to the pipe connection port groups 81A, 82A, respectively, are disposed in the piping chamber 861A; and the pipe 831A connected to the pipe connection port group 83A is disposed across the piping chambers 86T, 861A. That is, the pipe 831A is an example of a supply pipe disposed across the transfer module 3T and the first processing module 3A.

One piping chamber 862A surrounded by a partition wall 852A is provided on each of the +Y side and the −Y side of the first processing module 3A. The two piping chambers 862A are disposed adjacent to the −X side of each of the processing towers TW1, TW2, and the piping chamber 861A is disposed between the two piping chambers 862A.

The piping chamber 862A has a rectangular parallelepiped shape extending in the vertical direction, and the pipes 811A, 821A, 831A are disposed inside (see FIGS. 2, 4, and 7). Openings through which the pipes 811A, 821A, 831A are inserted are provided in the lower portion of the +Y side piping chamber 862A and the +Y side portion of the piping chamber 861A.

The tip side of the pipe 811A extends through the piping chamber 861A to the +Y side or −Y side piping chamber 862A and extends vertically upward in the piping chamber 862A. Further, the tip side of the pipe 811A turns downward in the upper portion of the piping chamber 862A, extends vertically downward, and again passes through the piping chamber 861A. The tip of the pipe 811A is then connected to one connection port of the pipe connection port group 81A in the piping chamber 861A. As thus described, in addition to the connection port for supplying the first processing liquid toward the inside of the substrate processing apparatus 1, the pipe connection port group 81A includes a connection port connected with a circulation pipe (e.g., circulation pipe 57 illustrated in FIG. 5) that returns to the external supply source the first processing liquid supplied to the substrate processing apparatus 1. This also applies to the pipe connection port groups 81B, 81C.

Similarly to the pipe 811A, the tip side of the pipe 821A extends through the piping chamber 861A to the +Y side or −Y side piping chamber 862A and extends vertically upward in the piping chamber 862A. Further, the tip side of the pipe 821A turns downward in the upper portion of the piping chamber 862A, extends vertically downward, and again passes through the piping chamber 861A. The tip of the pipe 821A is then connected to the pipe connection port group 82A in the piping chamber 861A. As thus described, in addition to the connection port for supplying the second processing liquid toward the inside of the substrate processing apparatus 1, the pipe connection port group 82A includes a connection port connected with a circulation pipe (e.g., circulation pipe 57 illustrated in FIG. 5) that returns to the external supply source the second processing liquid supplied to the substrate processing apparatus 1. This also applies to the pipe connection port groups 82B, 82C.

The tip side of the pipe 831A passes sequentially through the piping chambers 86T, 861A, extends to the +Y side or −Y side piping chamber 862A, and extends vertically upward in the piping chamber 862A (see FIGS. 2 and 4). Pipes extending toward the liquid processing units P1 to P3 or P4 to P6 are connected to the respective portions of the pipes 811A, 821A, 831A extending upward in the piping chamber 862A (see FIGS. 2 and 4). As a result, the first to third processing liquids are supplied from the respective pipes 811A, 821A, 831A to the nozzles of the liquid processing units P1 to P6.

The pipe connection port group 84A is provided inside the piping chamber 861A of the first processing module 3A. The pipe connection port group 84A includes two connection ports, one is provided between the processing tower TW1 and the pipe connection port group 81A, and the other is provided between the processing tower TW2 and the pipe connection port group 81A. Each connection port of the pipe connection port group 84A is connected to a supply source of a fourth processing liquid disposed outside the substrate processing apparatus 1. A pipe 841A directed to the liquid processing units P1 to P3 or P4 to P6 is connected to the pipe connection port group 84A. As a result, the fourth processing liquid is supplied from the pipe 841A to the liquid processing units P1 to P6.

The tip side of the pipe 831A extends from the pipe connection port group 83A to the −Y side, and the direction extending at the center in the Y-axis direction of the transfer module 3T changes to the −X direction. The tip side of the pipe 831A exits the piping chamber 86T and is disposed inward from the outside on the +X side of the piping chamber 861A of the first processing module 3A. A portion of the pipe 831A disposed between the piping chamber 86T and the piping chamber 861A is inserted into a cylindrical bellows member 91. The bellows member 91 is formed in an annular cylindrical shape that can be expanded and contracted along a central axis extending in the X-axis direction. The −X side opening of the bellows member 91 is coupled to the partition wall 851A of the piping chamber 861A (first piping chamber) with bolts or the like, and the +X side opening of the bellows member 91 is connected to the partition wall 85T of the piping chamber 86T (second piping chamber) with bolts or the like. The openings at both ends of the bellows member 91 are preferably coupled to the partition walls 851A, 85T using, for example, a seal member. Thereby, the inside of the bellows member 91 is attached in a sealed state.

In this case, the portion of the pipe 831A provided at the connection portion between the first processing module 3A and the transfer module 3T can be surrounded by the bellows member 91. This can reduce the leakage of the atmosphere to the outside of the substrate processing apparatus 1, the atmosphere including the processing liquid flowing through the pipe 831A at the connection portion between the first processing module 3A and the transfer module 3T.

<Piping Arrangement in Processing Modules 3B, 3C>

As illustrated in FIG. 7, a piping chamber 861B surrounded by a partition wall 851B is provided in the lower portion of the center in the Y-axis direction of the second processing module 3B. The piping chamber 861B is disposed between the processing towers TW3, TW4. A piping chamber 861C surrounded by a partition wall 851C is provided in the lower portion of the center in the Y-axis direction of the third processing module 3C. The piping chamber 861C is disposed between the processing towers TW5, TW6.

The cylindrical bellows member 91 is provided between the piping chamber 861B and the piping chamber 861C. The −X side opening of the bellows member 91 is coupled to the partition wall 851B on the +X side portion of the piping chamber 861B, and the +X side opening of the bellows member 91 is coupled to the partition wall 851C on the −X side portion of the piping chamber 861C.

The top of the piping chamber 861C is covered with a third floor FL3. The partition wall 851C on the +Y side of the piping chamber 861C forms a rectangular recess recessed on the −Y side. The top of the recess is covered with a fourth floor FL4, and the base portion 41 of the second transfer robot CR2 is installed on an upper surface FL4S of the fourth floor FL4. That is, the partition wall 851C of the piping chamber 861C is provided so as to surround the +X side, the −X side, and the −Y side of the base portion 41.

The third processing module 3C has a maintenance chamber 302C surrounded by a partition wall 301C. The maintenance chamber 302C has a rectangular parallelepiped shape and is disposed adjacent to the +X side of the processing towers TW5, TW6. A gateway 303C that communicates with the inside of the maintenance chamber 302C is provided at the central portion in the Y-axis direction on the +X side portion of the partition wall 301C of the maintenance chamber 302C. Further, a door 304C that opens and closes the gateway 303C is provided on the +X side portion of the partition wall 301C.

The top of the piping chamber 862C is covered with a plate-like fifth floor FL5. That is, the maintenance chamber 302C is divided vertically by the fifth floor FL5. An upper surface FL5S of the fifth floor FL5 is set below the upper end of the gateway 303C and is set at the same height as the lower end of the gateway 303C here. Further, the upper surface FL5S of the fifth floor FL5 and the upper surface FL3S of the third floor FL3 are set at the same height.

The operator can enter the maintenance chamber 302C by manually opening the door 304C and passing through the inside of the gateway 303C. Further, the operator can approach the second transfer robot CR2 by proceeding in the −X direction between the inside of the maintenance chamber 302C and between the processing towers TW5, TW6 while stepping on the upper surfaces FL5S, FL3S of the fifth floor FL5 and the third floor FL3, respectively. Thereby, the operator can perform the maintenance of the second transfer robot CR2.

Various electrical components including the controller 7 and the like may be installed inside the maintenance chamber 302C. In this case, the occupied space of the substrate processing apparatus 1 can be reduced.

A piping chamber 862C surrounded by a partition wall 852C is provided below the maintenance chamber 302C of the third processing module 3C. At the center in the Y-axis direction of the −X side portion of the piping chamber 862C and the +X side end portion of the piping chamber 861C, an opening for communicating the inside of the piping chambers 861C, 862C with each other is provided. Pipes 811C, 821C are inserted inside the opening.

Two piping chambers 863C surrounded by a partition wall 853C are provided on the +Y side and the −Y side of the third processing module 3C. Of the two piping chambers 863C, one is provided on the +Y side of the liquid processing units P13 to P15, and the other is provided on the +Y side of the liquid processing units P14 to P18. The piping chamber 861C is provided between the two piping chambers 863C. Openings through which the pipes 811C, 821C, 831C are inserted are provided inside the lower portion of the +Y side piping chamber 863C and the +X side portion of the piping chamber 861C.

The pipe connection port groups 81B, 82B are provided inside the piping chamber 861B. At least two each of pipes 811B, 821B are connected to the pipe connection port groups 81B, 82B, respectively. The pipes 811B, 821B are disposed in the piping chamber 861B.

One piping chamber 862B surrounded by a partition wall 852B is provided on each of the +Y side and the −Y side of the second processing module 3B. The two piping chambers 862B are disposed adjacent to the −X side of each of the processing towers TW3, TW4, and the piping chamber 861B is disposed between the two piping chambers 862B.

The piping chamber 862B has a rectangular parallelepiped shape extending in the vertical direction, and pipes 811B, 821B, 831B are disposed on the inside (see FIGS. 2, 4, and 7). Openings through which the pipes 811B, 821B, 831B are inserted are provided inside the lower portion of the +Y side piping chamber 862B, the +Y side portion of the piping chamber 861B, the lower portion of the −Y side piping chamber 862B, and the −Y side portion of the piping chamber 861B.

The tip side of the pipe 811B extends through the piping chamber 861B to the +Y side or −Y side piping chamber 862B and extends vertically upward in the piping chamber 862B (see FIG. 7). Further, the tip side of the pipe 811B turns downward in the upper portion of the piping chamber 862B, extends vertically downward, and again extends to the piping chamber 861B. The tip of the pipe 811B is then connected to one connection port of the pipe connection port group 81B in the piping chamber 861B.

Similarly to the pipe 811B, the tip side of the pipe 821B extends to the +Y side or −Y side piping chamber 862B through the piping chamber 861B (see FIG. 7) and extends vertically upward in the piping chamber 862B (see FIGS. 2 and 4). Further, the tip side of the pipe 821B turns downward in the upper portion of the piping chamber 862B, extends vertically downward, and again extends to the piping chamber 861B. The tip of the pipe 821B extending to the piping chamber 861B is connected to the pipe connection port group 82B.

The pipe connection port group 83C is provided inside the piping chamber 861C of the third processing module 3C. The pipe connection port group 83C is connected with at least two each of the pipes 831B for supplying the third processing liquid to the liquid processing units P7 to P12 of the processing towers TW3, TW4 and the pipes 831C for supplying the processing liquid to the liquid processing units P13 to P18 of the processing towers TW5, TW6.

The tip side of the pipe 831B extends in the −X direction, passes through the piping chambers 861C, 861B, and extends to the +Y side or −Y side piping chamber 862B (see FIG. 7). The tip side of the pipe 831B extends vertically upward in the piping chamber 862B (see FIGS. 2 and 4).

A cylindrical bellows member 91 is coupled between the +X side portion of the piping chamber 861B and the −X side portion of the piping chamber 861C. A portion of the pipe 831B disposed between the piping chambers 861B and 861C is inserted into the bellows member 91. The bellows member 91 is attached to each of the partition wall 851B, 851C with bolts or the like, for example.

Pipes extending toward the liquid processing units P7 to P9 or P10 to P12 are connected to the respective portions of the pipes 811B, 821B, 831B extending upward in the piping chamber 862B (see FIGS. 2 and 4). As a result, the first to third processing liquids are supplied from the respective pipes 811B, 821B, 831B to the nozzles of the liquid processing units P7 to P12.

The pipe connection port groups 81C, 82C are provided inside the piping chamber 862C of the third processing module 3C. At least two each of the pipes 811C, 821C for supplying the first and second processing liquids to the liquid processing units P13 to P18 of the processing towers TW5, TW6 are connected to the pipe connection port groups 81C, 82C, respectively.

The tip side of the pipe 811C passes sequentially through the piping chambers 862C, 861C, extends to the +Y side or −Y side piping chamber 863C, and extends vertically upward in the piping chamber 863C. Further, the tip side of the pipe 811C turns downward in the upper portion of the piping chamber 863C, extends vertically downward, and again extends to the piping chamber 862C through the piping chamber 861C (see FIGS. 2 and 4). The tip of the pipe 811C is then connected to one connection port of the pipe connection port groups 81C in the piping chamber 862C.

Similarly to the pipe 811C, the tip side of the pipe 821C extends through the piping chambers 862C, 861C to the +Y side or −Y side piping chamber 863C, and extends vertically upward in the piping chamber 863C. Further, the tip side of the pipe 821C turns downward in the upper portion of the piping chamber 863C, extends vertically downward, and again extends to the piping chamber 862C through the piping chamber 861C (see FIGS. 2 and 4). The tip of the pipe 821C is then connected to the pipe connection port group 82C in the piping chamber 862C.

The tip side of the pipe 831C extends in the +X direction, passes through the piping chamber 861C, and extends to the +Y side or −Y side piping chamber 862B. The tip side of the pipe 831B extends vertically upward in the piping chamber 862C (see FIGS. 2 and 4).

Pipes extending toward the liquid processing units P13 to P15 or P16 to P18 are connected to the respective portions of the pipes 811C, 821C, 831C extending upward in the piping chamber 863C (see FIGS. 2 and 4). As a result, the first to third processing liquids are supplied from the respective pipes 811C, 821C, 831C to the nozzles of the liquid processing units P13 to P18.

In the substrate processing apparatus 1, a pipe connection port group 81 (81A to 81C) for supplying the first processing liquid is provided in each of the processing modules 3A, 3B, 3C. For this reason, it is possible to prevent the occurrence of a large difference in pipe length between the pipes 811A to 811C configured to supply the first processing liquid to each processing unit. Further, the distance from each connection port to the processing unit can be shortened. In this case, for example, when the temperature of the first processing liquid is adjusted outside the substrate processing apparatus 1, it is possible to reduce the temperature change at the time of the passage of the first processing liquid through the pipes 811A to 811C. A similar effect can be obtained for the pipe connection port group 82 (82A to 82C) that supplies the third processing liquid.

The supply source of the third processing liquid may supply a plurality of processing liquids that are mixed immediately before the nozzles provided in the liquid processing units P1 to P18. For example, the pipe connection port group 83 (83A, 83C) may be provided with pipe connection ports for independently supplying sulfuric acid and hydrogen peroxide solution, and each liquid may be supplied to each of the liquid processing units P1 to P18. Then, in each of the liquid processing units P1 to P18, a sulfuric acid/hydrogen peroxide mixture (SPM) may be generated by mixing these liquids immediately before being supplied to the substrate W.

A pipe connection port group 84B is provided at the center in the X-axis direction in the piping chamber 861B. The pipe connection port group 84B includes two connection ports, one is provided between the processing tower TW3 and the pipe connection port group 81B, and the other is provided between the processing tower TW4 and the pipe connection port group 81B. In addition, a pipe connection port group 84C is provided at a position on the −X side with respect to the center in the X-axis direction in the piping chamber 861C. The pipe connection port group 84C includes two connection ports, one is provided between the processing tower TW5 and the pipe connection port group 83C, and the other is provided between the processing tower TW6 and the pipe connection port group 83C.

Similarly to the pipe connection port group 84A, the respective connection ports of the pipe connection port groups 84B, 84C are also connected to the supply source of the fourth processing liquid. A pipe 841B linked to each of the liquid processing units P7 to P9 or P10 to P12 is connected to the pipe connection port group 84B, and a pipe 841C linked to each of the liquid processing units P13 to P15 or P16 to P18 is connected to the pipe connection port group 84C. As a result, the fourth processing liquid is supplied from the pipes 841B and 841C to the liquid processing units P7 to P18.

As illustrated in FIGS. 2 and 4, one piping chamber 871A is provided below each of the liquid processing units P1, P4 provided in the first processing module 3A. The two piping chambers 871A are provided with a drainage port 881A. A drainage pipe 882A linked to each of the liquid processing units P1 to P3 or P4 to P6 is connected to the drainage port 881A. The drainage pipe 882A is connected to the drainage port 513 provided in each of the processing chambers 50 of the liquid processing units P1 to P6, and the processing liquid discharged from each of the liquid processing units P1 to P6 is discharged out of the substrate processing apparatus 1 through the drainage port 881A.

Each of the two piping chambers 871A is provided with three exhaust ports 891A. The exhaust port 891A is provided with an exhaust pipe (not illustrated) linked to each of the liquid processing units P1 to P3 or P4 to P6. Each discharge pipe is connected to the exhaust port 515 provided in each of the processing chambers 50 of the liquid processing units P1 to P3 or P4 to P6, and an atmosphere discharged from each of the liquid processing units P1 to P6 is discharged out of the substrate processing apparatus 1 through the exhaust port 891A.

As illustrated in FIGS. 2 and 4, in the processing modules 3B, 3C, similarly to the first processing module 3A, piping chambers 871B, 871C are respectively provided below the liquid processing units P7, P10 and below the liquid processing units P13, P16. The piping chambers 871B, 871C are provided with drainage ports 881B, 881C, respectively, and drainage pipes 882B, 882C are connected to the drainage ports 881B, 881C, respectively. Each of the drainage pipes 882B, 882C is connected to the liquid processing units P7 to P9, P10 to P12, P13 to P15 or P16 to P18 and drains the processing liquid discharged from each of the liquid processing units P7 to P18 out of the substrate processing apparatus 1 through the drainage ports 881B, 881C. Further, exhaust ports 891B, 891C are provided in the piping chambers 871B, 871C, respectively, and exhaust pipes (not illustrated) are connected to the exhaust ports 891B, 891C, respectively. Each exhaust pipe is connected to the liquid processing units P7 to P9, P10 to P12, P13 to P15, or P16 to P18, and an atmosphere discharged from each of the liquid processing units P7 to P18 is discharged out of substrate processing apparatus 1 through the exhaust ports 891B, 891C.

When the configuration such as the processing modules 3A, 3B, 3C and the transfer module 3T is adopted, an increase or decrease in the number of processing towers (i.e., the number of processing units) can be facilitated. This point will be described with reference to FIGS. 8 to 10. In the following description, elements having similar functions to the elements already described may be denoted by the same reference numerals or reference numerals added with alphabetic characters, and detailed description may be omitted.

Figure 8:
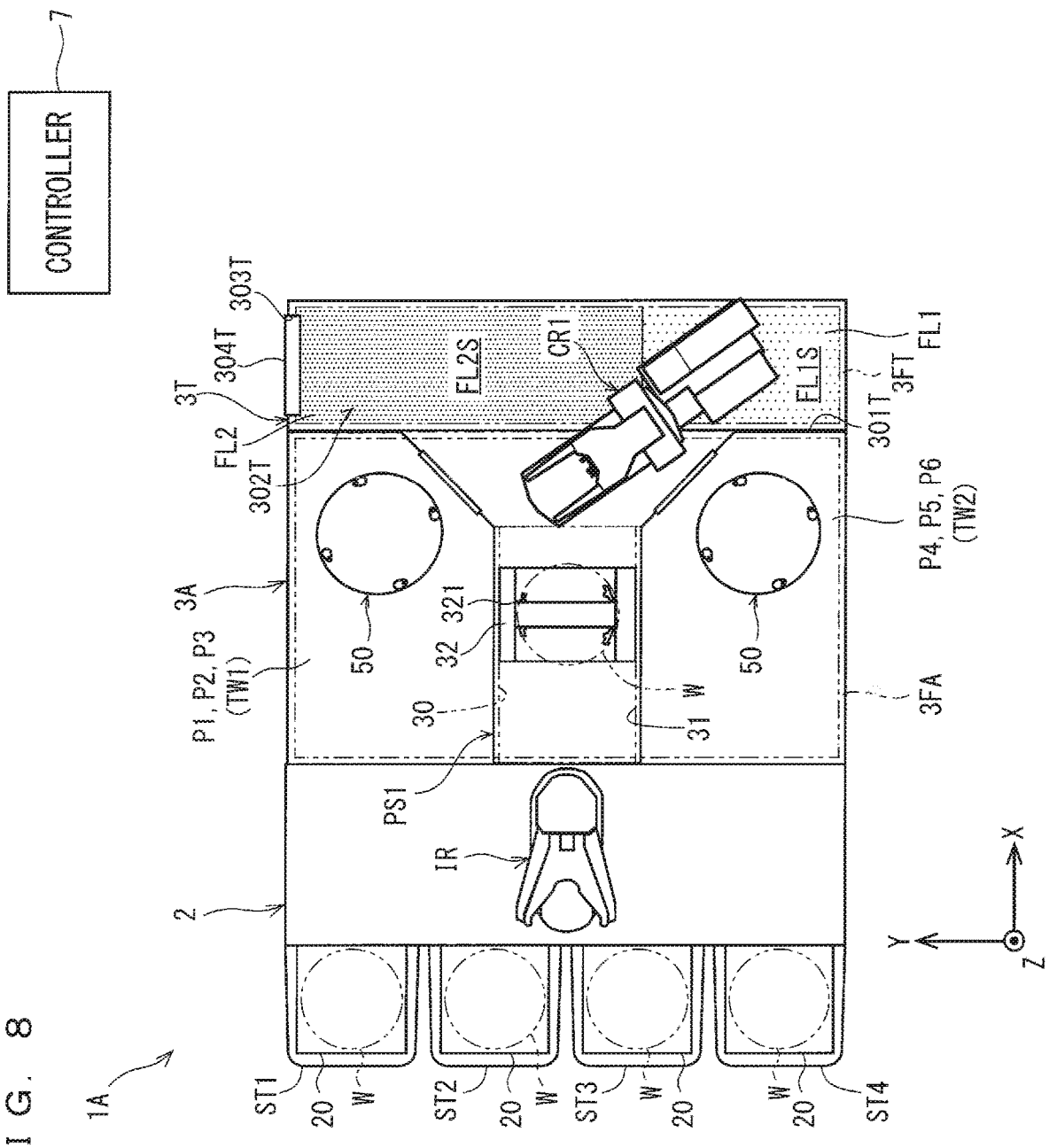
FIG. 8 is a schematic plan view illustrating a substrate processing apparatus 1A having two processing towers.

FIG. 8 is a schematic plan view illustrating a substrate processing apparatus 1A having two processing towers. The substrate processing apparatus 1A illustrated in FIG. 8 includes one first processing module 3A and one transfer module 3T. That is, as compared with the substrate processing apparatus 1, the second and third processing modules 3B, 3C are omitted in the substrate processing apparatus 1A. Since the substrate processing apparatus 1A includes the two processing towers TW1, TW2, the substrate processing apparatus 1A includes a total of six liquid processing units P1 to P6. As described above, the first to fourth processing liquids can be supplied to the liquid processing units P1 to P6 from the pipe connection port groups 81A, 81B, 81D provided in the first processing module 3A and from the pipe connection port group 81C provided in the transfer module 3T (see FIG. 7). As described above, the substrate processing apparatus 1A having only two processing towers can be easily constructed by omitting the processing modules 3B, 3C.

Figure 9:
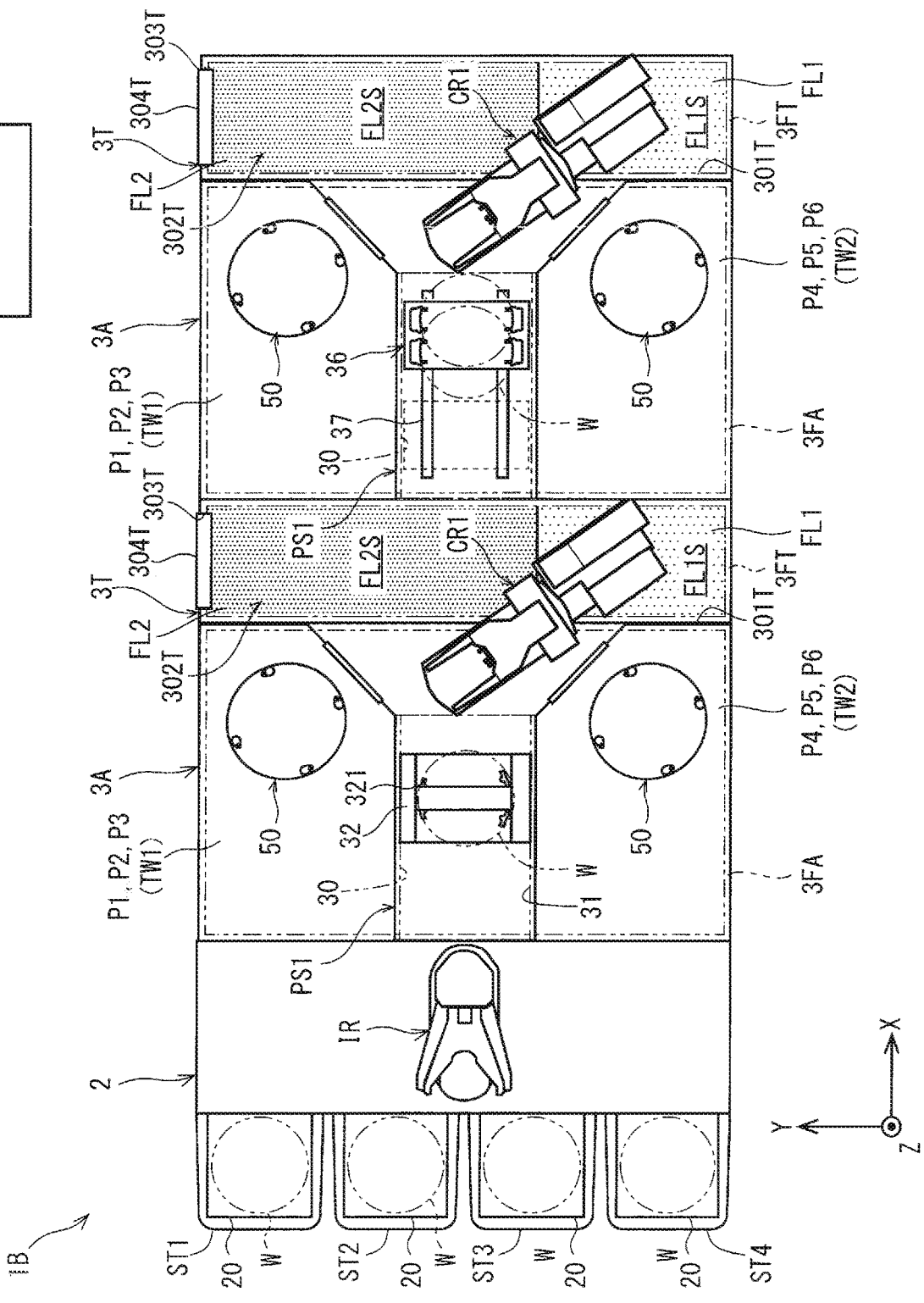
FIG. 9 is a schematic plan view illustrating a substrate processing apparatus 1B having four processing towers.

FIG. 9 is a schematic plan view illustrating a substrate processing apparatus 1B having four processing towers. In the substrate processing apparatus 1B illustrated in FIG. 9, the processing section 3 includes two first processing modules 3A and two transfer modules 3T. More specifically, in the processing section 3, the first processing module 3A and the transfer module 3T are alternately coupled toward the +X side. Hereinafter, the first processing module 3A adjacent to the +X side of the indexer section 2 and the transfer module 3T adjacent to the +X side thereof are taken as a first set, and the first processing module 3A and the transfer module 3T adjacent to the +X side of the first transfer module 3T are taken a second set.

The substrate holder 32 is installed in the transfer chamber 31 of the first delivery part PS1 in the first set, and the shuttle transfer apparatus 36 is installed in the transfer chamber 31 of the first delivery part PS1 in the second set. The shuttle transfer apparatus 36 moves linearly in the X-axis direction along the rail 37 installed in the transfer chamber 31.

In the substrate processing apparatus 1B, the substrate W supplied from the indexer section 2 to the first delivery part PS1 (substrate holder 32) in the first set is passed by the first transfer robot CR1 in the first set to the shuttle transfer apparatus 36 of the first delivery part PS1 in the second set. Then, the shuttle transfer apparatus 36 transfers the substrate W to the +X side, so that the substrate W approaches the first transfer robot CR1 in the second set. Then, the first transfer robot CR1 in the second set receives the substrate W from the shuttle transfer apparatus 36 and can load the substrate into one of the liquid processing units P1 to P6 in the second set. The substrate W after being subjected to the specified processing by the liquid processing units P1 to P6 is passed to the shuttle transfer apparatus 36 of the first delivery part PS1 by the first transfer robot CR1 in the second set, and is transferred to the −X side by the shuttle transfer apparatus 36. Subsequently, the first transfer robot CR1 in the first set receives the processed substrate W and passes the substrate to the first delivery part PS1 in the first set. As a result, the processed substrate W is returned to the indexer section 2. Even when the number of processing towers is four, the substrate W can be supplied to the processing unit of each processing tower as in the substrate processing apparatus 1B.

In addition, by alternately coupling the first processing module 3A and the transfer module 3T including the first transfer robot CR1 on the +X side of the indexer section 2, the processing tower can be easily added.

Figure 10:
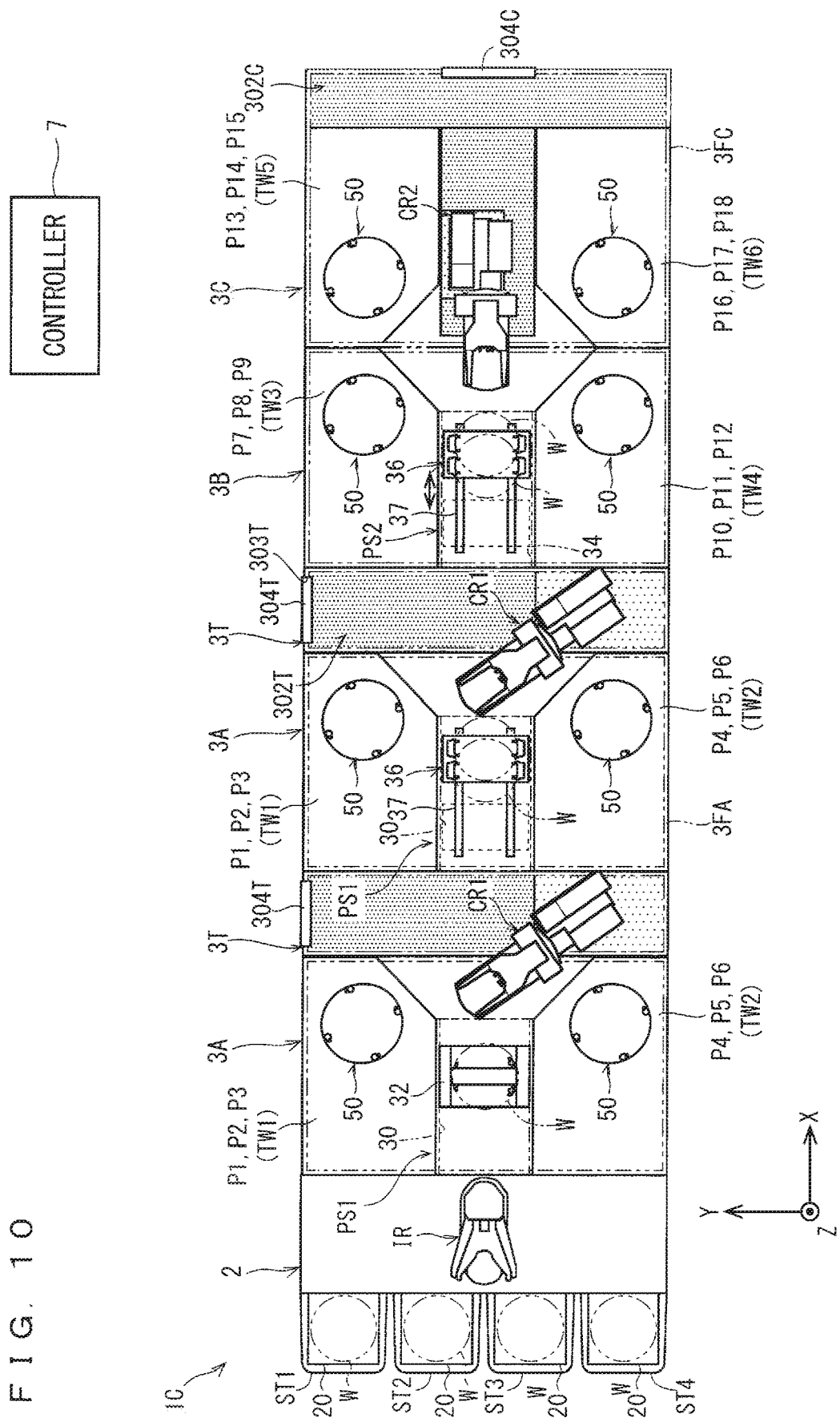
FIG. 10 is a schematic plan view illustrating a substrate processing apparatus 1C.

FIG. 10 is a schematic plan view illustrating a substrate processing apparatus 1C. The substrate processing apparatus 1C has a configuration in which the second and third processing modules 3B, 3C are further coupled to the substrate processing apparatus 1B. In this manner, the number of processing units can be increased by coupling the plurality of first processing modules 3A and the plurality of transfer modules 3T and coupling the second and third processing modules 3B, 3C.

Figure 11:
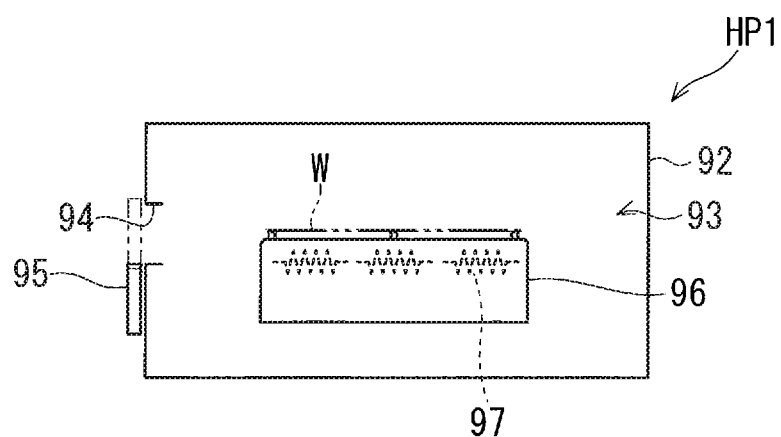
FIG. 11 illustrates a heating processing unit HP1.

It is not essential for all of the liquid processing units P1 to P18 to process the substrate W with the processing liquid as illustrated in FIG. 5, and the liquid processing unit may be replaced with a processing unit that performs other specified processing. FIG. 11 is a diagram illustrating a heating processing unit HP1. The heating processing unit HP1 is an apparatus for performing heating processing on a single substrate W. The heating processing unit HP1 includes a processing chamber 93 surrounded by a partition wall 92. A part of the side wall portion of the processing chamber 93 is provided with an opening 94 for loading the substrate W into the processing chamber 93 and for unloading the substrate W out of the processing chamber 93. Further, the processing chamber 93 is provided with a shutter 95 that opens and closes the opening 94. The shutter 95 is lifted or lowered between a closed position (indicated by a two-dot chain line in FIG. 11) that closes the opening 94 by a shutter lifting mechanism (not illustrated) and an open position (indicated by a solid line in FIG. 11) that opens the opening 94.

In the processing chamber 93, a stage 96 for supporting the substrate W in a horizontal posture is provided. A heater 97 is provided inside the stage 96. The heater 97 includes a resistance wire and a power source for applying a voltage to the resistance wire. Here, the resistance wire of the heater 97 is provided in the hollow stage 96, and radiant heat is radiated from the upper surface of the stage 96 by applying a voltage to the resistance wire. The substrate W supported by the stage 96 is heated by this radiant heat. Note that the aspect of heating the substrate W in the processing chamber 93 is not limited to the illustrated example. For example, a fan heater that ejects hot air heated by a heat source may be provided inside the processing chamber 93, and the substrate W may be directly or indirectly heated by the hot air.

Figure 12:
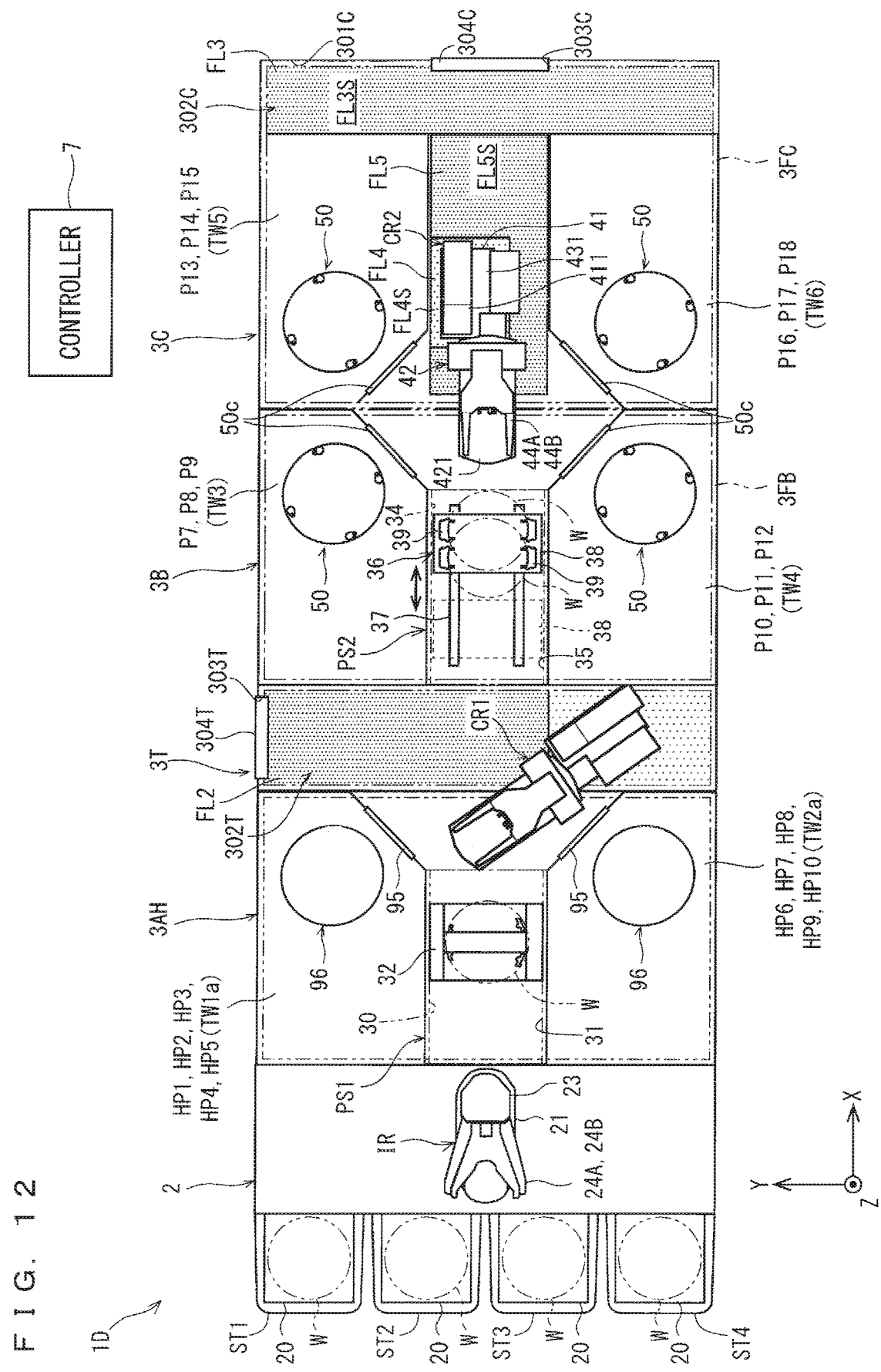
FIG. 12 is a schematic plan view illustrating a substrate processing apparatus 1D.

FIG. 12 is a schematic plan view illustrating a substrate processing apparatus 1D. The substrate processing apparatus 1D is different from the substrate processing apparatus 1 illustrated in FIG. 1 in including a first processing module 3AH instead of the first processing module 3A. The first processing module 3AH is different from the first processing module 3A in including processing towers TW1*a*, TW2*a* instead of the processing towers TW1, TW2. The processing towers TW1a, TW2a are each made up of five heating processing units HP1 to HP5 and HP6 to HP10 stacked in the vertical direction. The heating processing units HP2 to HP10 have the same configuration as the heating processing unit HP1.

The number of stacked heating processing units HP1 may be set in accordance with the height in the vertical direction at which the first transfer robot CR1 can transfer the substrate W. Here, the heating processing unit HP1 has a smaller height in the vertical direction than the liquid processing unit P1. For this reason, the number (5) of stacked heating processing units HP1 to HP5 in the processing tower TW1a is larger than the number (3) of stacked liquid processing units P1 to P3 in the processing tower TW1.

As thus described, by providing the first processing module 3AH, for example, the substrate W on which the liquid processing has been performed in any of the liquid processing units P7 to P18 of the processing modules 3B, 3C can be loaded into any of the heating processing units HP1 to HP10 of the first processing module 3AH and subjected to heating processing. By this heating processing, moisture attached to the substrate W can be removed. Thus, in the substrate processing apparatus 1D, the substrate processing including the liquid processing step and the heating step after the liquid processing step can be performed on one substrate W.

2. Modifications

Although the preferred embodiment has been described above, the present invention is not limited to the above, but various modifications are possible.

For example, in the substrate processing apparatus 1, a reversing apparatus that reverses the upper and lower surfaces of the substrate W may be provided. By reversing the substrate W with the reversing apparatus, the main surfaces on both sides of the substrate W can be processed in the substrate processing apparatus 1. Such a reversing apparatus may, for example, be provided in the upper portion of the first delivery part PS1 in the first processing module 3A, and the substrate W may be loaded into or unloaded out of the reversing apparatus by the indexer robot IR or the first transfer robot CR1.

For example, both or one of the first transfer robot CR1 and the second transfer robot CR2 may be an articulated robot. In the above preferred embodiment, since the number of the heating processing units HP1 to HP5 stacked in the processing tower TW1a is five, the transfer robot is configured to include the vertical actuator 43 that can be easily moved in the vertical direction. However, when the substrate can be transferred to the stacked processing towers, the base portion 41 is not required by making the transfer robot an articulated robot. As a result, the space of the maintenance chamber 302T in the transfer module 3T can be expanded to further improve the maintenance efficiency of the operator.

While the present invention has been described in detail, the above description is in all aspects illustrative and the present invention is not limited thereto. It is understood that innumerable modifications not illustrated can be envisaged without departing from the scope of the present invention. The configurations described in the above preferred embodiment and modifications can be appropriately combined or omitted so long as not contradicting each other.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus for processing a substrate, comprising:
a first processing module having a first specified processing unit that performs specified processing on said substrate, and a first delivery part that temporarily holds said substrate;
a substrate supply part that is disposed on a first directional side of said first processing module and supplies said substrate from said first directional side to said first delivery part, a direction from said first processing module to said substrate supply part being defined as a first direction; and
a transfer module being disposed on a second directional side opposite to said first directional side of said first processing module, a direction from said first processing module to said transfer module being defined as a second direction, said transfer module having a first transfer apparatus that unloads said substrate out of said first delivery part in said second direction and loads said substrate into said first specified processing unit, wherein
said transfer module includes
a frame that defines a placement space in which said first transfer apparatus is placed,
a first floor being disposed inside said placement space, a base portion of said first transfer apparatus being installed on said first floor,
a second floor disposed on a third directional side with respect to said first floor inside said placement space, a direction from said first floor to said second floor being defined as a third direction, said third direction being a horizontal direction orthogonal to said first direction, and
a gateway that communicates, on said second floor, said placement space with an outside of said frame.

2. The substrate processing apparatus according to claim 1, wherein said first transfer apparatus includes
a hand that holds said substrate, and
a vertical actuator including a vertical motor that moves said hand in a vertical direction.

3. The substrate processing apparatus according to claim 2, wherein said first floor is provided vertically below said second floor.

4. The substrate processing apparatus according to claim 2, wherein
said first transfer apparatus includes a horizontal actuator including a movement motor that moves said hand in a direction to move away from or approach the base portion in the horizontal direction, and
said first floor is provided on a side opposite to said third direction with respect to said first delivery part.

5. The substrate processing apparatus according to claim 4, wherein said first specified processing unit has a nozzle that supplies fluid to said substrate.

6. The substrate processing apparatus according to claim 5, further comprising:
a supply pipe that is disposed across said transfer module and said first processing module and supplies said fluid to said nozzle.

7. The substrate processing apparatus according to claim 6, further comprising:
a cylindrical bellows member into which said supply pipe is inserted,
wherein said first processing module has a first piping chamber in which said supply pipe is disposed, said transfer module has a second piping chamber in which said supply pipe is disposed, and an opening on one end of said bellows member is coupled to said first piping chamber, and an opening on the other end is coupled to said second piping chamber.

8. The substrate processing apparatus according to claim 5, wherein a pipe connection port to which said fluid is supplied is provided below said second floor.

9. The substrate processing apparatus according to claim 1, comprising:

a second processing module disposed on said second directional side of said transfer module and having a second delivery part that temporarily holds said substrate loaded by said first transfer apparatus from said first directional side, and a second specified processing unit that performs specified processing on said substrate;

a third processing module disposed on said second directional side of said second processing module and having a third specified processing unit that performs specified processing on said substrate; and a second transfer apparatus that transfers said substrate between said second delivery part and said second specified processing unit and between said second delivery part and said third specified processing unit.

10. A transfer module for transferring a substrate in a substrate processing apparatus including a first processing module, said first processing module having a first specified processing unit that performs specified processing on said substrate and having a first delivery part that temporarily holds said substrate supplied from a supplying place, said first delivery part facing to said supplying place in a first direction, said transfer module comprising:

a first transfer apparatus that unloads said substrate out of said first delivery part in a second direction opposite to said first direction and loads said substrate to said first specified processing unit from a loading place, said first specified processing unit facing to said loading place in said second direction, said first processing module facing to said first transfer apparatus in said second direction;

a frame that defines a placement space in which said first transfer apparatus is placed;

a first floor disposed inside said placement space, a base portion of said first transfer apparatus being installed on said first floor;

a second floor disposed inside said placement space, a direction from said first floor to said second floor being defined as a third direction, said third direction being a horizontal direction orthogonal to said second direction; and a gateway that communicates, on said second floor, said placement space with an outside of said frame.

11. The transfer module according to claim 10, wherein said first transfer apparatus includes a hand that holds said substrate, and a vertical actuator including a vertical motor that moves said hand in a vertical direction.

12. The transfer module according to claim 11, wherein said first transfer apparatus includes a horizontal actuator including a movement motor that moves said hand in a direction to move away from or approach the base portion in the horizontal direction, and said first floor is provided on a side opposite to said third direction with respect to said first delivery part.

13. The transfer module according to claim 10, wherein said first floor is provided vertically below said second floor.

14. The transfer module according to claim 10, wherein said first specified processing unit has a nozzle that supplies fluid to said substrate.

15. The transfer module according to claim 14, further comprising:

a supply pipe that is disposed across said transfer module and said first processing module and supplies said fluid to said nozzle.

16. The transfer module according to claim 15, further comprising:

a cylindrical bellows member into which said supply pipe is inserted, wherein said transfer module has a second piping chamber in which said supply pipe is disposed, and an opening on one end of said bellows member is couplable to a piping chamber of said first processing module, and an opening on the other end is coupled to said second piping chamber.

17. The transfer module according to claim 14, wherein a pipe connection port to which said fluid is supplied is provided below said second floor.

18. A coupling module provided in a substrate processing apparatus that processes a substrate, comprising:

a first processing module that processes said substrate supplied from a first directional side; and a transfer module coupled to said first processing module on a second directional side opposite to said first directional side, wherein said first processing module has a first specified processing unit that performs specified processing on said substrate, and a first delivery part that temporarily holds said substrate, and said transfer module has a first transfer apparatus that unloads said substrate out of said first delivery part to said second directional side and loads said substrate into said first specified processing unit from said second directional side, and wherein said transfer module includes a frame that defines a placement space in which said first transfer apparatus is placed, a first floor being disposed inside said placement space, a base portion of said first transfer apparatus being installed on said first floor, a second floor disposed on a third directional side with respect to said first floor inside said placement space, a direction from said first floor to said second floor being defined as a third direction, said third direction being a horizontal direction orthogonal to said first direction, and a gateway that communicates, on said second floor, said placement space with an outside of said frame.

19. The coupling module according to claim 18, wherein said first transfer apparatus includes a hand that holds said substrate, and a vertical actuator including a vertical motor that moves said hand in a vertical direction.

20. The coupling module according to claim 19, wherein said first transfer apparatus includes a horizontal actuator including a movement motor that moves said hand in a direction to move away from or approach the base portion in the horizontal direction, and said first floor is provided on a side opposite to said third direction with respect to said first delivery part.

21. The coupling module according to claim 18, wherein said first floor is provided vertically below said second floor.

22. The coupling module according to claim 18, wherein said first specified processing unit has a nozzle that supplies fluid to said substrate.

23. The coupling module according to claim 22, further comprising:
   a supply pipe that is disposed across said transfer module and said first processing module and supplies said fluid to said nozzle.

24. The coupling module according to claim 23, further comprising:
   a cylindrical bellows member into which said supply pipe is inserted,
   wherein
   said transfer module has a second piping chamber in which said supply pipe is disposed, and
   an opening on one end of said bellows member is couplable to a piping chamber of said first processing module, and an opening on the other end is coupled to said second piping chamber.

25. The coupling module according to claim 22, wherein a pipe connection port to which said fluid is supplied is provided below said second floor.

* * * * *